United States Patent
Seok et al.

(10) Patent No.: US 11,482,448 B2
(45) Date of Patent: Oct. 25, 2022

(54) PLANARIZATION METHOD OF A CAPPING INSULATING LAYER, A METHOD OF FORMING A SEMICONDUCTOR DEVICE USING THE SAME, AND A SEMICONDUCTOR DEVICE FORMED THEREBY

(71) Applicant: Samsung Electronics Co., Ltd., Suwon-si (KR)

(72) Inventors: Hansol Seok, Hwaseong-si (KR); Chungki Min, Hwaseong-si (KR); Changsun Hwang, Hwaseong-si (KR); Gihwan Kim, Suwon-si (KR); Jongheun Lim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 210 days.

(21) Appl. No.: 17/035,827

(22) Filed: Sep. 29, 2020

(65) Prior Publication Data

US 2021/0134661 A1 May 6, 2021

(30) Foreign Application Priority Data

Nov. 1, 2019 (KR) .................. 10-2019-0138719

(51) Int. Cl.
*H01L 21/768* (2006.01)
*H01L 27/11582* (2017.01)
(Continued)

(52) U.S. Cl.
CPC .. *H01L 21/76829* (2013.01); *H01L 21/76816* (2013.01); *H01L 21/76819* (2013.01);
(Continued)

(58) Field of Classification Search
CPC ......... H01L 21/76829; H01L 21/76816; H01L 21/76819; H01L 21/76828;
(Continued)

(56) References Cited

U.S. PATENT DOCUMENTS 7,452,818 B2   11/2008   Hunt et al.
8,822,287 B2   9/2014   Kim et al.
(Continued)

FOREIGN PATENT DOCUMENTS

JP      2011066257 A    3/2011
KR   1020070056672 A    6/2007
KR   1020200033378 A    3/2020

*Primary Examiner* — Shahed Ahmed
*Assistant Examiner* — Vicki B. Booker
(74) *Attorney, Agent, or Firm* — Myers Bigel, P.A.

(57) ABSTRACT

Semiconductor devices and methods of forming the same are provided. The methods may include forming a stacked structure that may include a stacking area and a stepped area and may include first layers and second layers alternately stacked. The second layers may have a stepped shape in the stepped area, and the stepped area may include at least one flat area and at least one inclined stepped area. The methods may also include forming a capping insulating layer covering the stacked structure. The capping insulating layer may include a first capping region having a first upper surface and a second capping region having a second upper surface at a lower level than the first upper surface. The methods may further include patterning the capping insulating layer to form protrusions at least one of which overlaps the stepped area and then planarizing the capping insulating layer.

20 Claims, 30 Drawing Sheets

(51) Int. Cl.
H01L 23/522 (2006.01)
H01L 23/528 (2006.01)
H01L 23/535 (2006.01)

(52) U.S. Cl.
CPC .. *H01L 21/76828* (2013.01); *H01L 21/76877* (2013.01); *H01L 21/76895* (2013.01); *H01L 23/5226* (2013.01); *H01L 23/5283* (2013.01); *H01L 23/535* (2013.01); *H01L 27/11582* (2013.01)

(58) Field of Classification Search
CPC ......... H01L 21/76877; H01L 21/76895; H01L 23/5226; H01L 23/5283; H01L 23/535; H01L 27/11582; H01L 27/11575; H01L 21/3105; H01L 21/311; H01L 27/1157; H01L 29/66825; H01L 21/31051; H01L 21/324; H01L 21/7684; H01L 21/76846; H01L 21/76897; H01L 27/11524; H01L 27/11529; H01L 29/42324; H01L 29/788
See application file for complete search history.

(56) References Cited

U.S. PATENT DOCUMENTS

| | | |
|---|---|---|
| 8,975,731 B2 | 3/2015 | Min |
| 9,773,682 B1 | 9/2017 | Hsu et al. |
| 2004/0005518 A1* | 1/2004 | Park .................. H01L 21/31144 430/314 |
| 2006/0141790 A1* | 6/2006 | Kim .................. H01L 21/31053 257/E21.244 |
| 2020/0090943 A1 | 3/2020 | Hwang et al. |

* cited by examiner

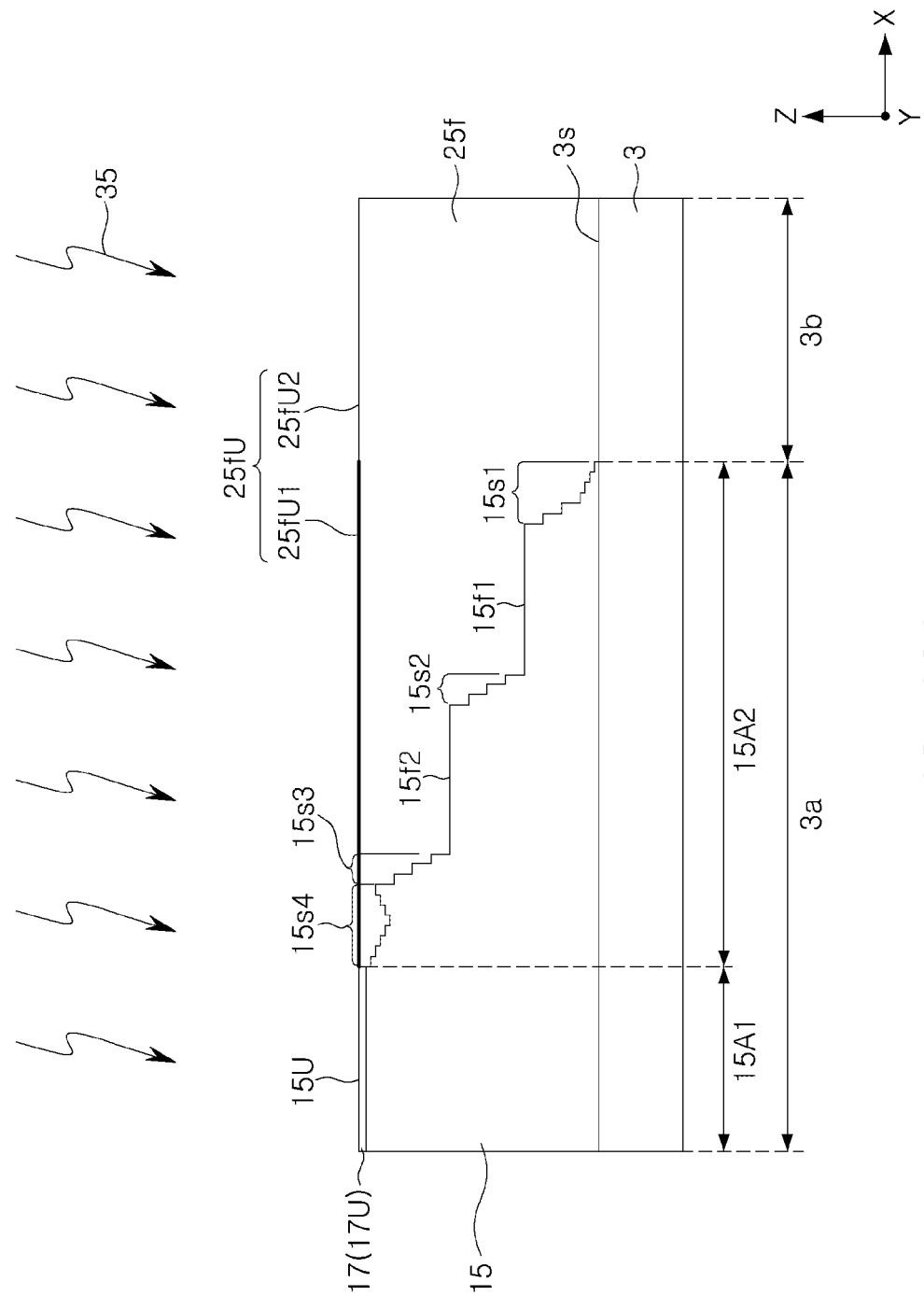

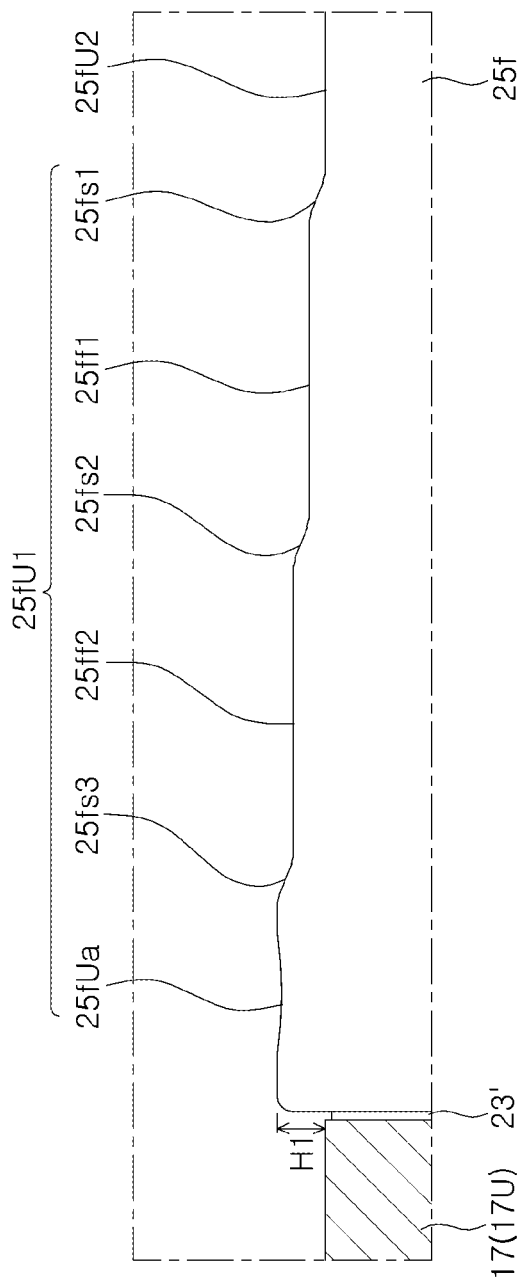

PLANARIZATION METHOD OF A CAPPING INSULATING LAYER, A METHOD OF FORMING A SEMICONDUCTOR DEVICE USING THE SAME, AND A SEMICONDUCTOR DEVICE FORMED THEREBY

CROSS-REFERENCE TO RELATED APPLICATION(S)

This application claims priority under 35 USC 119(a) of Korean Patent Application No. 10-2019-0138719 filed on Nov. 1, 2019 in the Korean Intellectual Property Office, the entire disclosure of which is incorporated herein by reference.

BACKGROUND

The present inventive concept relates to a semiconductor device, and more particularly, to a planarization method of a capping insulating layer, a method of forming a semiconductor device using the same, and a semiconductor device formed thereby.

To increase the degree of integration of semiconductor devices, semiconductor devices including gates stacked, while being spaced apart from each other, in a direction that is perpendicular to an upper surface of a substrate have been developed. As the number of stacked gates increases, unexpected process defects may occur and may make it difficult to improve the productivity of semiconductor devices.

SUMMARY

Embodiments of the present inventive concept provide methods of forming a semiconductor device, in which the flatness of a capping insulating layer surrounding a stacked structure may be improved.

Embodiments of the present inventive concept provide methods for improving the degree of integration of semiconductor devices.

Embodiments of the present inventive concept provide methods for improving the productivity of a semiconductor device.

According to embodiments of the present inventive concept, a method of forming a semiconductor device may include forming a stacked structure and a planarization stop layer on a first region of a substrate, the stacked structure including a stacking area having a flat upper surface and a stepped area adjacent to the stacking area, the stacked structure including a plurality of first layers and a plurality of second layers repeatedly stacked in a vertical direction that is perpendicular to an upper surface of the substrate, an uppermost layer of the plurality of first layers and the plurality of second layers being a first layer located on a top level, and the planarization stop layer being formed on the uppermost layer; forming a capping insulating layer covering the planarization stop layer and the stacked structure and covering a second region of the substrate adjacent to the first region of the substrate, the capping insulating layer including a first capping region having a first upper surface, a second capping region having a second upper surface of a lower level than the first upper surface, and a third capping region between the first capping region and the second capping region; patterning the capping insulating layer to form a plurality of protrusions spaced apart in a horizontal direction on the first region of the substrate, the horizontal direction being a direction parallel to the upper surface of the substrate, at least one of the plurality of protrusions overlapping the stepped area; planarizing the capping insulating layer on which the plurality of protrusions are formed to form a planarized capping insulating layer; partially etching the planarized capping insulating layer to form a partially etched capping insulating layer; performing an annealing process to convert the partially etched capping insulating layer into a densified capping insulating layer; forming a first upper insulating layer covering the densified capping insulating layer and the uppermost layer of the stacked structure; forming a channel hole penetrating through the first upper insulating layer and the stacking area of the stacked structure; forming a vertical memory structure in the channel hole; forming a contact plug on the vertical memory structure; and forming a bit line on the contact plug.

According to embodiments of the present inventive concept, a method of forming a semiconductor device may include forming a first stacked structure on a first region of a substrate, the first stacked structure including a first stacking area and a first stepped area adjacent to the first stacking area, the first stacked structure including a plurality of first layers and a plurality of second layers repeatedly stacked in a vertical direction that is perpendicular to an upper surface of the substrate, the plurality of second layers being arranged in a stepped shape in the first stepped area; forming a first capping insulating layer covering the first stacked structure on the first region of the substrate and covering a second region of the substrate adjacent to the first region of the substrate, the first capping insulating layer including a first capping region having a first upper surface, a second capping region having a second upper surface at a lower level than the first upper surface, and a third capping region between the first capping region and the second capping region; patterning the first capping insulating layer to form a plurality of first protrusions spaced apart in a horizontal direction on the first region of the substrate, the horizontal direction being a direction parallel to the upper surface of the substrate, and at least one of the plurality of first protrusions overlapping the first stepped area; and planarizing the capping insulating layer on which the plurality of first protrusions are formed.

According to embodiments of the present inventive concept, a method of forming a semiconductor device may include forming a stacked structure on a first region of a substrate, the stacked structure including a stacking area and a stepped area adjacent to the stacking area and including a plurality of first layers and a plurality of second layers repeatedly stacked in a vertical direction that is perpendicular to an upper surface of the substrate, the plurality of second layers being arranged in a stepped shape in the stepped area, the stepped area of the stacked structure including one or a plurality of flat areas and inclined stepped areas adjacent to the one or the plurality of flat areas, respectively; forming a capping insulating layer covering the stacked structure on the first region of the substrate and covering a second region of the substrate adjacent to the first region of the substrate, the capping insulating layer including a first capping region having a first upper surface, a second capping region having a second upper surface of a lower level than the first upper surface, and a third capping region between the first capping region and the second capping region; patterning the capping insulating layer to form a plurality of protrusions spaced apart in a horizontal direction on the first region of the substrate, the horizontal direction being a direction parallel to the upper surface of the substrate, and at least one of the plurality of protrusions overlapping the stepped area; and planarizing the capping insulating layer on which the plurality of protrusions are formed.

According to embodiments of the present inventive concept, a semiconductor device may include a stacked structure on a first region of a substrate, the stacked structure including a stacking area and a stepped area adjacent to the stacking area, the stacked structure including a plurality of first layers and a plurality of second layers repeatedly stacked in a vertical direction that is perpendicular to an upper surface of the substrate, the plurality of second layers being arranged in a stepped shape in the stepped area, the stepped area of the stacked structure including one or a plurality of flat areas, and inclined stepped areas adjacent to the one or plurality of flat areas, respectively; a capping insulating layer covering the stepped area of the stacked structure and covering a second region of the substrate adjacent to the first region of the substrate, the capping insulating layer including an upper surface having a first surface and a second surface at a lower level than the first surface, the first surface overlapping the stepped area of the stacked structure, the first surface including inclined portions located at different height levels, respectively; an upper insulating layer on the stacked structure and the capping insulating layer; and a vertical memory structure penetrating through the upper insulating layer and the stacked structure.

According to embodiments of the present inventive concept, a semiconductor device may include a lower stacked structure on a first region of a substrate, the lower stacked structure including a lower stacking area and a lower stepped area adjacent to the lower stacking area; a lower capping insulating layer covering the lower stepped area of the lower stacked structure and covering a second region of the substrate adjacent to the first region of the substrate, the lower capping insulating layer including a first upper surface having a first portion and a second portion at a lower level than the first portion, the first portion overlapping the lower stepped area of the lower stacked structure, the first portion including first inclined portions positioned at different height levels, respectively; an upper stacked structure on the lower stacked structure, the upper stacked structure including an upper stacking area and an upper stepped area adjacent to the upper stacking area; an upper capping insulating layer covering the upper stepped area of the upper stacked structure and covering the lower capping insulating layer, the upper capping insulating layer including a second upper surface having a third portion and a fourth portion at a lower level than the third portion, the third portion overlapping the upper stepped area of the upper stacked structure and including second inclined portions positioned at different height levels, respectively; an upper insulating layer on the upper stacked structure and the upper capping insulating layer; and a vertical memory structure penetrating through the upper insulating layer, the upper stacked structure, and the lower stacked structure.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Throughout the specification, terms such as "upper", "intermediate", "lower", etc. are used to distinguish relative positions between components, and the scope of the present inventive concept is not limited by these terms. Thus, terms such as "top", "intermediate" and "bottom" may be replaced with other terms, such as "first," "second," and "third," or with other terms, and may be used to describe the components of the specification.

Figure 1A:
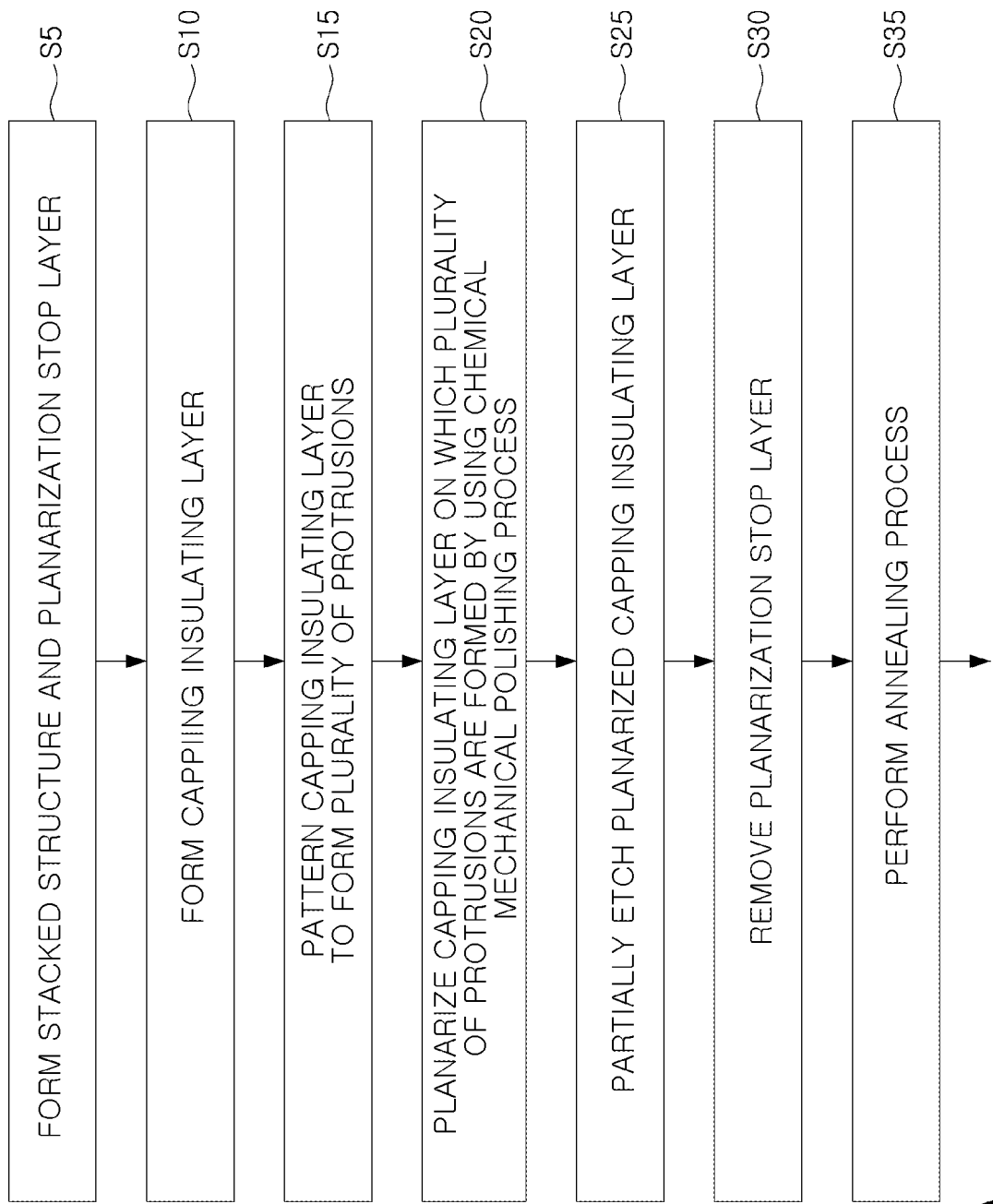
FIGS. 1A and 1B are process flowcharts illustrating a method of forming a semiconductor device according to example embodiments of the present inventive concept.
Figure 1B:
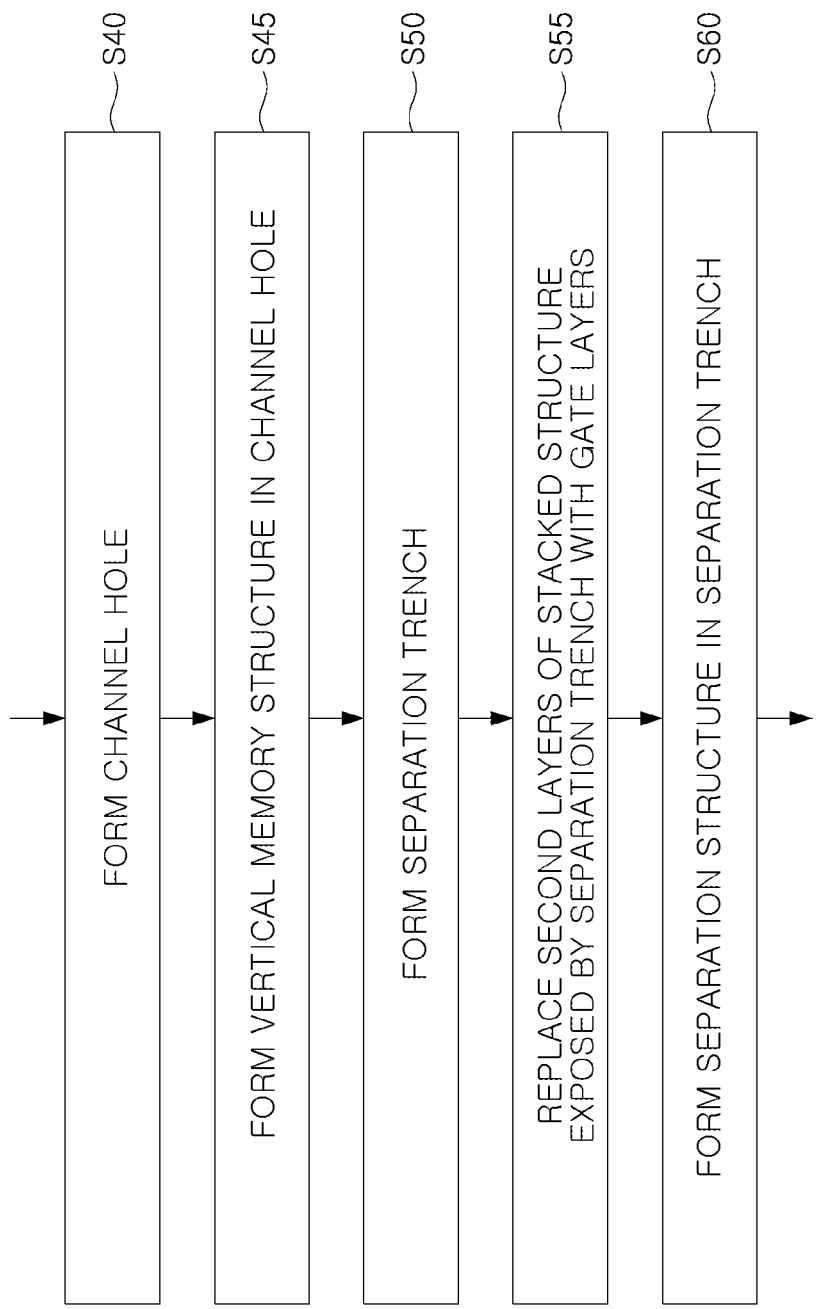

Hereinafter, various examples of a method of forming a semiconductor device according to example embodiments of the present inventive concept and a semiconductor device formed by the same will be described with reference to FIGS. 1A through 15B. FIGS. 1A and 1B are process flowcharts illustrating a method of forming a semiconductor device according to example embodiments of the present inventive concept, and FIGS. 2A to 12C cross-sectional views illustrating examples of a method of forming a semiconductor device according to example embodiments of the present inventive concept. FIGS. 13A to 15B are cross-sectional views illustrating a method of forming a semiconductor device according to example embodiments of the present inventive concept.

Figure 2A:
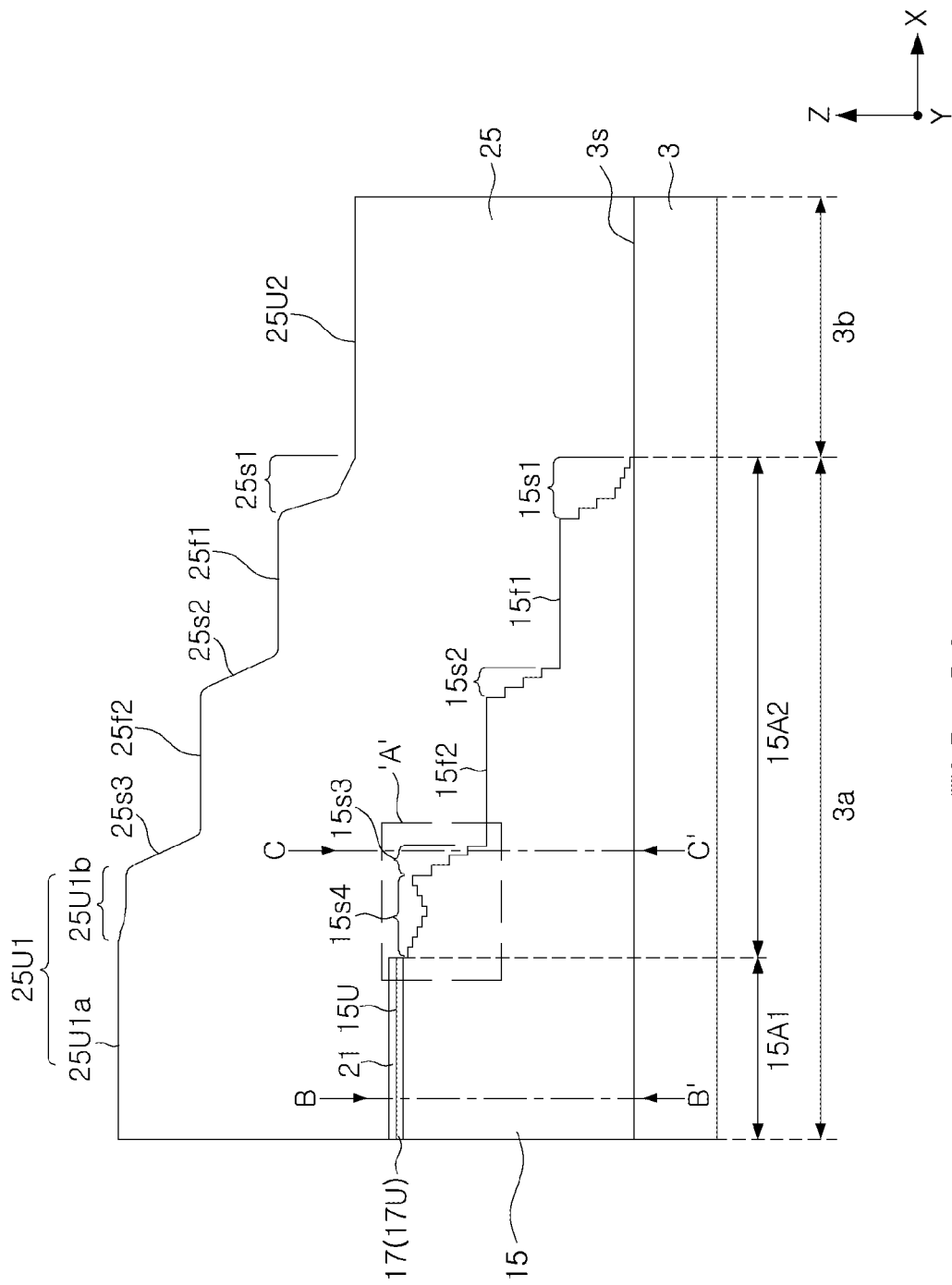
FIGS. 2A through 12C are diagrams illustrating a method of forming a semiconductor device according to example embodiments of the present inventive concept.
Figure 2B:
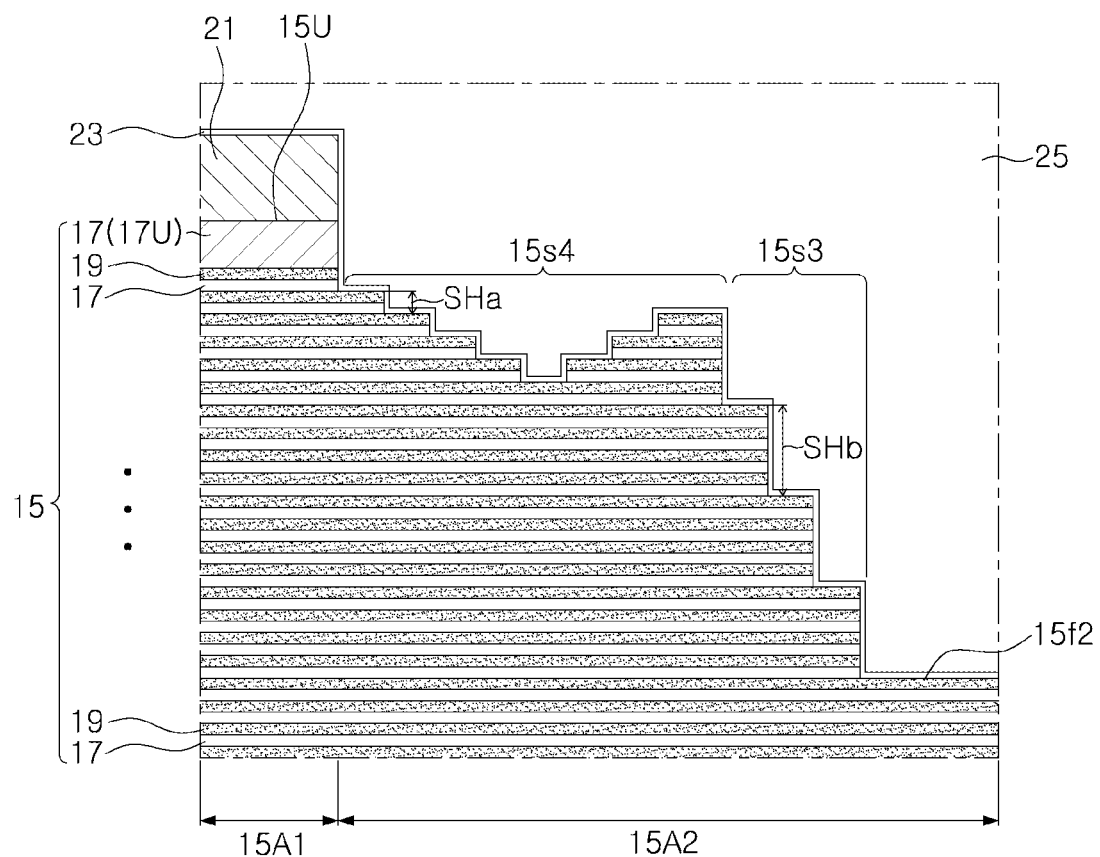
Figure 2C:
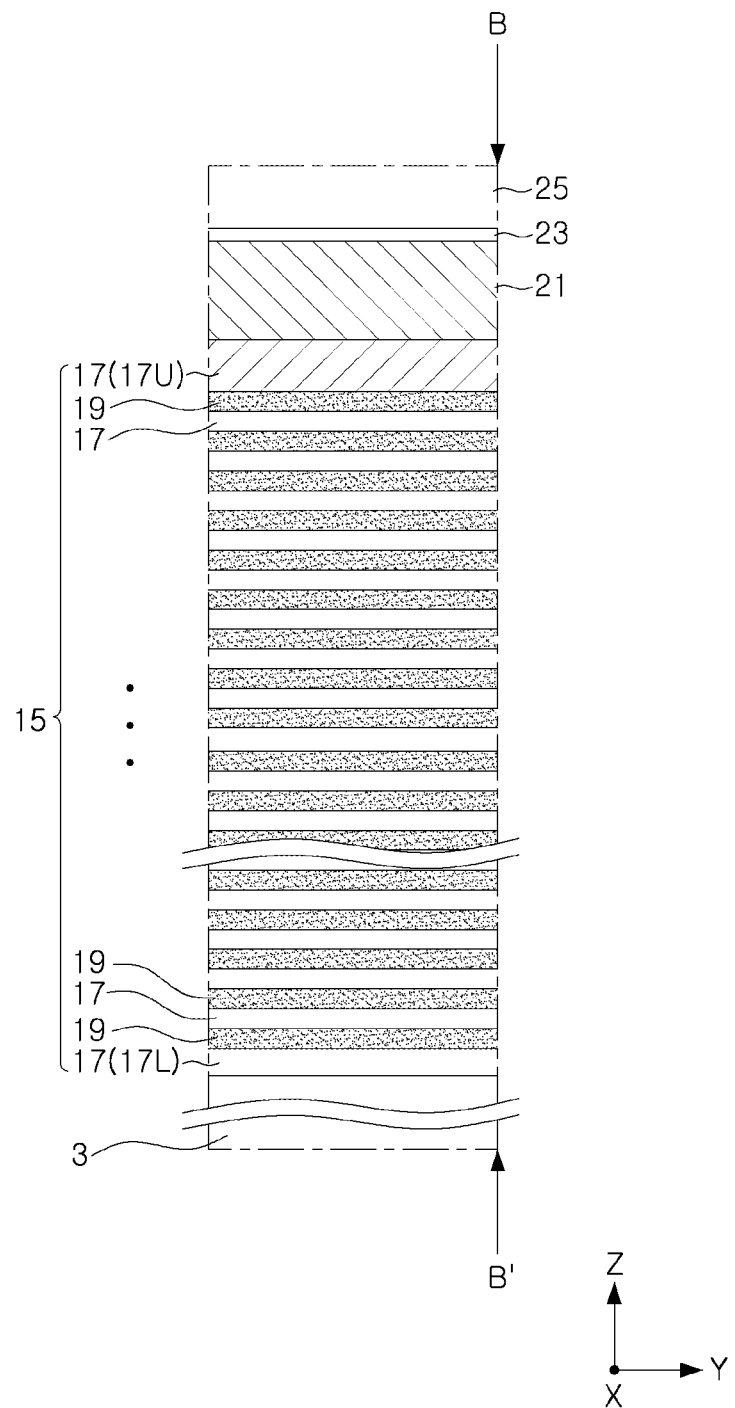
Figure 2D:
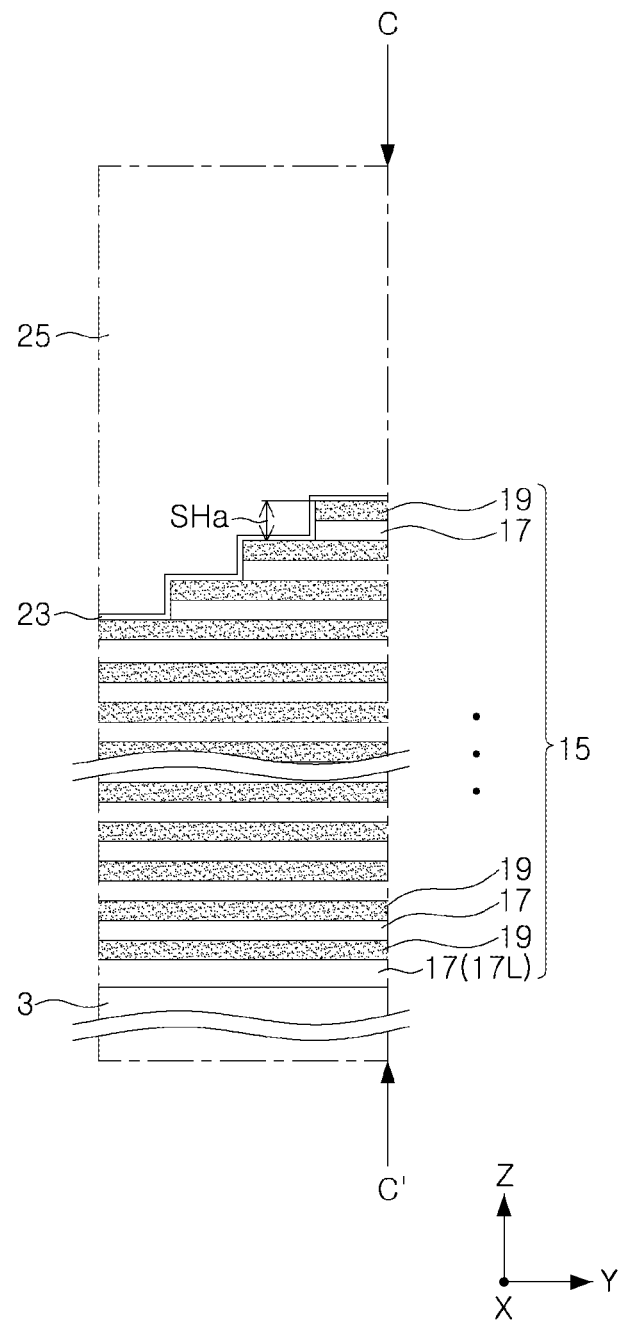

In FIGS. 2A to 12C, FIGS. 2A, 4 to 9A, 10A, 11A and 12A are cross-sectional views taken along a first horizontal direction to illustrate an example of a method of forming a semiconductor device according to example embodiments. FIG. 2B is an enlarged cross-sectional view illustrating a portion indicated by 'A' of FIG. 2A, and FIG. 2C is an enlarged cross-sectional view of the portion indicated by line B-B' of FIG. 2A, taken along a second horizontal direction that is perpendicular to the first horizontal direction. FIG. 2D is an enlarged cross-sectional view of a portion indicated by line C-C' of FIG. 2A, taken along the second horizontal direction, and FIG. 9B is an enlarged view of the portion D of FIG. 9A. FIG. 9C is an enlarged view of the portion D of FIG. 9A. FIGS. 10B and 10C are each an enlarged cross-sectional view of a portion of FIG. 10A. FIG. 11B is an enlarged cross-sectional view illustrating a portion indicated by line B1-B1' of FIG. 11A taken along the second horizontal direction. FIG. 12B is an enlarged cross sectional view illustrating a portion indicated by line B1-B1' of FIG. 12A, and FIG. 12C is an enlarged cross-sectional view illustrating a portion indicated by line C1-C1' of FIG. 12A taken along the second horizontal direction.

First, referring to FIGS. 1A, and FIGS. 2A to 12B, a method of forming a semiconductor device according to example embodiments will be described.

Referring to FIGS. 1A and 2A to 2C, a substrate 3 may be prepared. The substrate 3 may include a semiconductor substrate. A stacked structure 15 and a planarization stop layer 21 may be formed (S5). The stacked structure 15 and the planarization stop layer 21 may be formed on a first region 3a of the substrate 3.

In the substrate 3, an area in which the stacked structure 15 is formed is defined as the first region 3a, and an area in which the stacked structure 15 is not formed is defined as a second region 3b. In the substrate 3, the first region 3a and the second region 3b may be adjacent to each other.

The stacked structure 15 may include a plurality of first layers 17 and a plurality of second layers 19 stacked alternately with the plurality of first layers 17 in the vertical direction Z. In the stacked structure 15, an uppermost layer may be a first uppermost layer 17U positioned at the top of the plurality of first layers 17. The vertical direction Z may be a direction that is perpendicular to an upper surface 3s of a substrate 3.

In some embodiments, the plurality of first layers 17 may include a first insulating material (e.g., silicon oxide, etc.), and the plurality of second layers 19 may include a second insulating material (e.g., silicon nitride, etc.) different from the first insulating material. When the plurality of second layers 19 is formed of the second insulating material, the plurality of second layers 19 may be sacrificial gate layers.

In some embodiments, the plurality of first layers 17 may include an insulating material (e.g., silicon oxide, etc.), and the plurality of second layers 19 may include a conductive material (e.g., doped silicon, a metal nitride, a metal-semiconductor compound, or a metal). When the plurality of second layers 19 are formed of a conductive material, the second layers 19 may be gate layers.

The stacked structure 15 may include a stacking area 15A1 having a flat upper surface 15U on the first region 3a of the substrate 3, and a stepped area 15A2 adjacent to the stacking area 15A1.

The stepped area 15A2 of the stacked structure 15 may include one or a plurality of flat areas 15f1 and 15f2, and inclined stepped areas 15s1, 15s2 and 15s3 respectively adjacent to the one or the plurality of flat areas 15f1 and 15f2.

In some embodiments, as the one or a plurality of flat areas 15f1 and 15f2, a plurality of the flat areas 15f1 and 15f2 may be disposed. For example, the plurality of flat areas 15f1 and 15f2 may include a first flat area 15f1 and a second flat area 15f2 positioned at different height levels. For example, the distance between the first flat area 15f1 and the upper surface 3s of the substrate 3 may be greater than a distance between the second flat area 15f2 and the upper surface 3s of the substrate 3.

Each of the plurality of flat areas 15f1 and 15f2 may be substantially parallel to the upper surface 3s of the substrate 3.

In some embodiments, the stepped area 15A2 of the stacked structure 15 may include an upper stepped area 15s4, an upper inclined stepped area 15s3, the second flat area 15f2, an intermediate inclined stepped area 15s2, the first flat area 15f1 and a lower inclined stepped area 15s1 arranged in the first horizontal direction X.

The first flat area 15f1 may be disposed between the lower inclined stepped area 15s1 and the inclined stepped area inclined stepped area 15s2, and the second flat area 15f2 may be disposed between the intermediate inclined stepped area 15s2 and the upper inclined stepped area 15s3.

In some embodiments, the upper stepped area 15s4 may have a stepped shape that is gradually lowered toward the first step SHa and then rises again toward the first step SHa in the first horizontal direction X. The first step SHa may be substantially equal to a distance between upper surfaces of the pair of second layers 19 adjacent to each other in the vertical direction Z. In some embodiments, the first step SHa may be equal to a thickness of a single pair of the first layer 17 and the second layer 19 in the vertical direction Z as illustrated in FIG. 2B.

In some embodiments, each of the upper inclined stepped area 15s3, the intermediate inclined stepped area 15s2, and the lower inclined stepped area 15s1 may have a step shape gradually lowered to a second step SHb greater than a first step SHa in the first horizontal direction X. The second step SH2 may be substantially equal to a distance between the upper surface of an uppermost second layer and the lower surface of the second uppermost layer of a plurality of the second layers 19, for example, five second layers 19 arranged sequentially in the vertical direction Z. In some embodiments, the second step SHb may be equal to a thickness of four pairs of the first layer 17 and the second layer 19 in the vertical direction Z as illustrated in FIG. 2B. In some embodiments, the upper stepped area 15s4 may have the rise of the first step SHa, and the upper inclined stepped area 15s3 may have the rise of the second step SHb that is greater than the first step SHa as illustrated in FIG. 2B.

Each of the upper stepped area 15s4, the upper inclined stepped area 15s3, the second flat area 15f2, the intermediate inclined stepped area 15s2, the first flat area 15f1 and the lower inclined stepped area 15s1 may have a step shape gradually lowering or increasing toward the first step SHa in the second horizontal direction Y that is perpendicular to the first horizontal direction X as illustrated in FIG. 2D.

The length of at least one of the upper inclined stepped area 15s3, the intermediate inclined stepped area 15s2, and the lower inclined stepped area 15s1 in the first horizontal direction X may be less than a length of each of the plurality of flat areas 15f1 and 15f2 in the first horizontal directions X.

The planarization stop layer 21 may be formed on the stacking area 15A1 of the stacked structure 15. The planarization stop layer 21 may be self-aligned with the first uppermost layer 17U of the stacked structure 15.

In some embodiments, the planarization stop layer 21 may be formed of silicon nitride, or a substitute material.

A capping insulating layer 25 may be formed (S10). The capping insulating layer 25 covers the stacked structure 15 and the planarization stop layer 21 on the first region 3a of the substrate 3, and covers the second region 3b of the substrate 3. The capping insulating layer 25 may be formed of, for example, silicon oxide. The capping insulating layer 25 may be formed of silicon oxide or porous silicon oxide having a lower density than silicon oxide of the plurality of first layers 17. For example, the capping insulating layer 25 may be formed of TEOS oxide having a faster deposition rate or formation rate than silicon oxide of the plurality of first layers 17 to improve productivity of a semiconductor device. In some embodiments, the capping insulating layer 25 may be formed of an oxide formed using flowable CVD or spin on glass (SOG). "An element A covers an element B" (or similar language) means that the element A is on the element B but does not necessarily mean that the element A covers the element B entirely.

Prior to forming the capping insulating layer 25, a buffer insulating layer 23 conformally covering the surface of the planarization stop layer 21 on the substrate 3 and the stepped area 15A2 of the stacked structure 15 may be formed. The buffer insulating layer 23 may be formed of, for example, silicon oxide.

The capping insulating layer 25 may include a first capping region 25U1 having a first upper surface, a second capping region 25U2 having a second upper surface having a lower level than the first upper surface, and third capping regions 25s1, 25f1, 25s2, 25f2 and 25s3 between the first capping region 25U1 and the second capping region 25U2.

In the capping insulating layer 25, the first capping region 25U1 may overlap the entire stacking area 15A1 and overlap a portion of the stepped area 15A2. The second capping region 15U2 may overlap the second region 3*b* of the substrate 3.

An upper surface of the first capping region 25U1 may include a first surface 25U1*a* parallel to the upper surface 3*s* of the substrate 3, and a second surface 25U1*b* extending and bent from the first surface 25U1*a*.

The third capping regions 25*s*1, 25*f*1, 25*s*2, 25*f*2 and 25*s*3 may overlap the rest of the stepped area 15A2 that does not overlap the first capping region 25U1, and may overlap a portion of the second region 3*b*.

The third capping region (25*s*1, 25*f*1, 25*s*2, 25*f*2, 25*s*3) may include one or a plurality of flat surfaces 25*f*1 and 25*f*2 spaced apart from the first and second capping regions 25U1 and 25U2, and inclined surfaces 25*s*1, 25*s*2 and 25*s*3 adjacent to the one or flat surfaces 25*f*1 and 25*f*2.

In some embodiments, the one or the plurality of flat surfaces 25*f*1 and 25*f*2 may be formed in plural. For example, the plurality of flat surfaces 25*f*1 and 25*f*2 may include a first flat surface 25*f*1 and a second flat surface 25*f*2 positioned at different height levels. The inclined surfaces 25*s*1, 25*s*2, and 25*s*3 may include a lower inclined surface 25*s*1, an intermediate inclined surface 25*s*2, and a third inclined surface 25*s*3. Accordingly, the third capping regions 25*s*1, 25*f*1, 25*s*2, 25*f*2, and 25*s*3 may include the third inclined surface 25*s*3, the second flat surface 25*f*2, the intermediate inclined surface 25*s*2, the first flat surface 25*f*1 and the lower inclined surface 25*s*1 sequentially disposed in the first horizontal direction X.

In some embodiments, the substrate 3 may be a semiconductor substrate. However, the present inventive concept is not limited thereto, and the substrate 3 may be modified into a structure including a plurality of substrates and a circuit region between the plurality of substrates. An example in which the substrate 3 may be deformed will be described with reference to FIG. 3.

Figure 3:
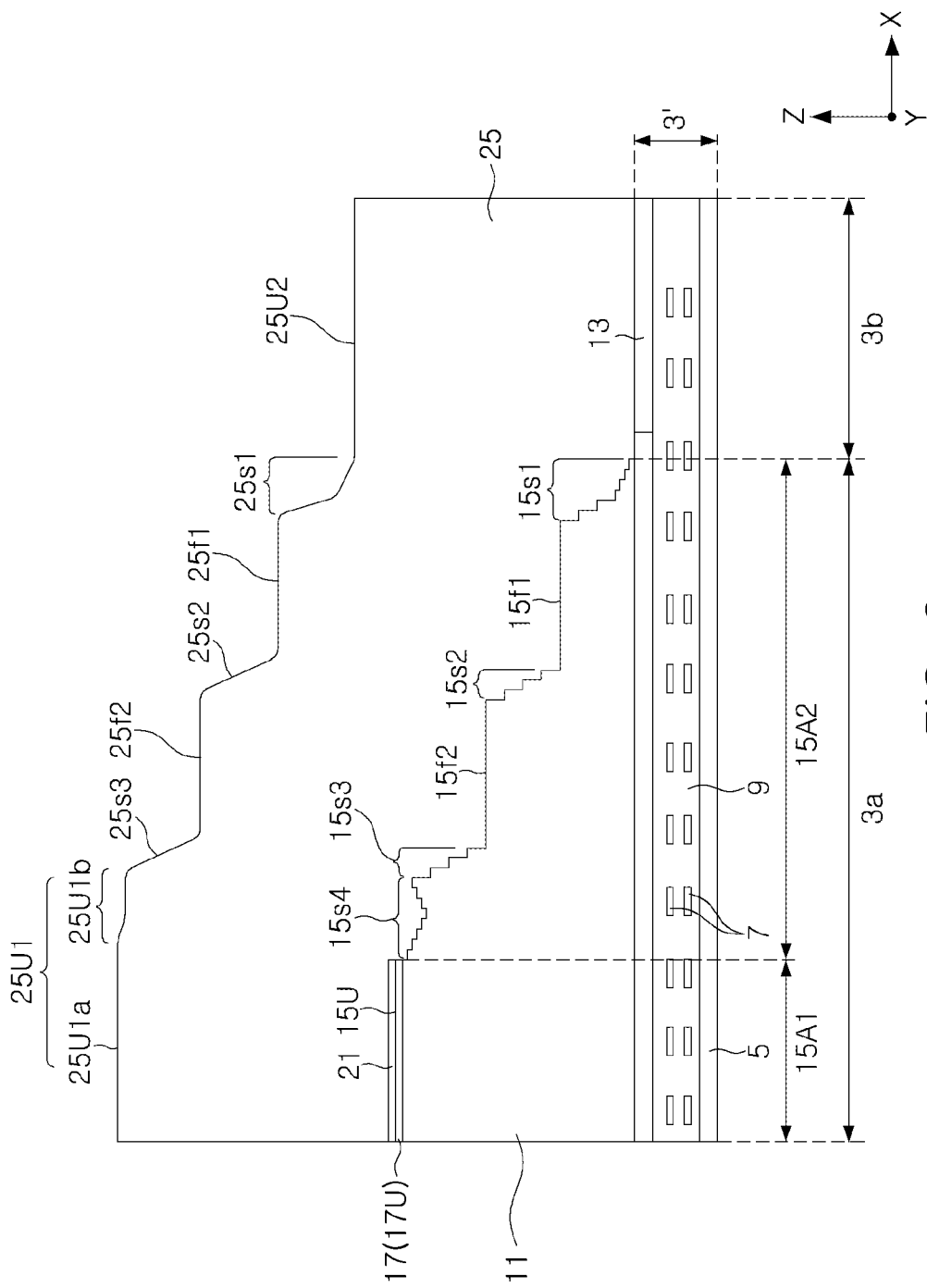

In some embodiments, referring to FIG. 3, a substrate 3' may include a first substrate 5, circuit regions 7 and 9 on the first substrate 5, a second substrate 11 on the circuit regions 7 and 9, and an intermediate insulating layer 13 covering the side surface of the second substrate 11 on the circuit regions 7 and 9. The circuit regions 7 and 9 may include wirings 7 that may constitute an integrated circuit and a lower insulating layer 9 covering the wirings 7. The first substrate 5 may be a semiconductor substrate. The second substrate 11 may include at least one of a silicon material and a conductive material. For example, the second substrate 11 may be formed of doped silicon, metal nitride (e.g., TiN or WN, etc.), a metal-semiconductor compound (e.g., TiSi, WSi, etc.), or a metal (e.g., W, etc.).

Hereinafter, even if there is no description, in the semiconductor substrate formed by using the substrate 3 in FIG. 2A, the substrate (3 in FIG. 2A) may be replaced with the substrate (3' in FIG. 3).

Referring back to FIG. 1A, the capping insulating layer 25 may be patterned to form a plurality of protrusions (S15). Hereinafter, an example of a process (S15) of forming the plurality of protrusions by patterning the capping insulating layer 25 will be described with reference to FIGS. 4 to 7.

Figure 4:
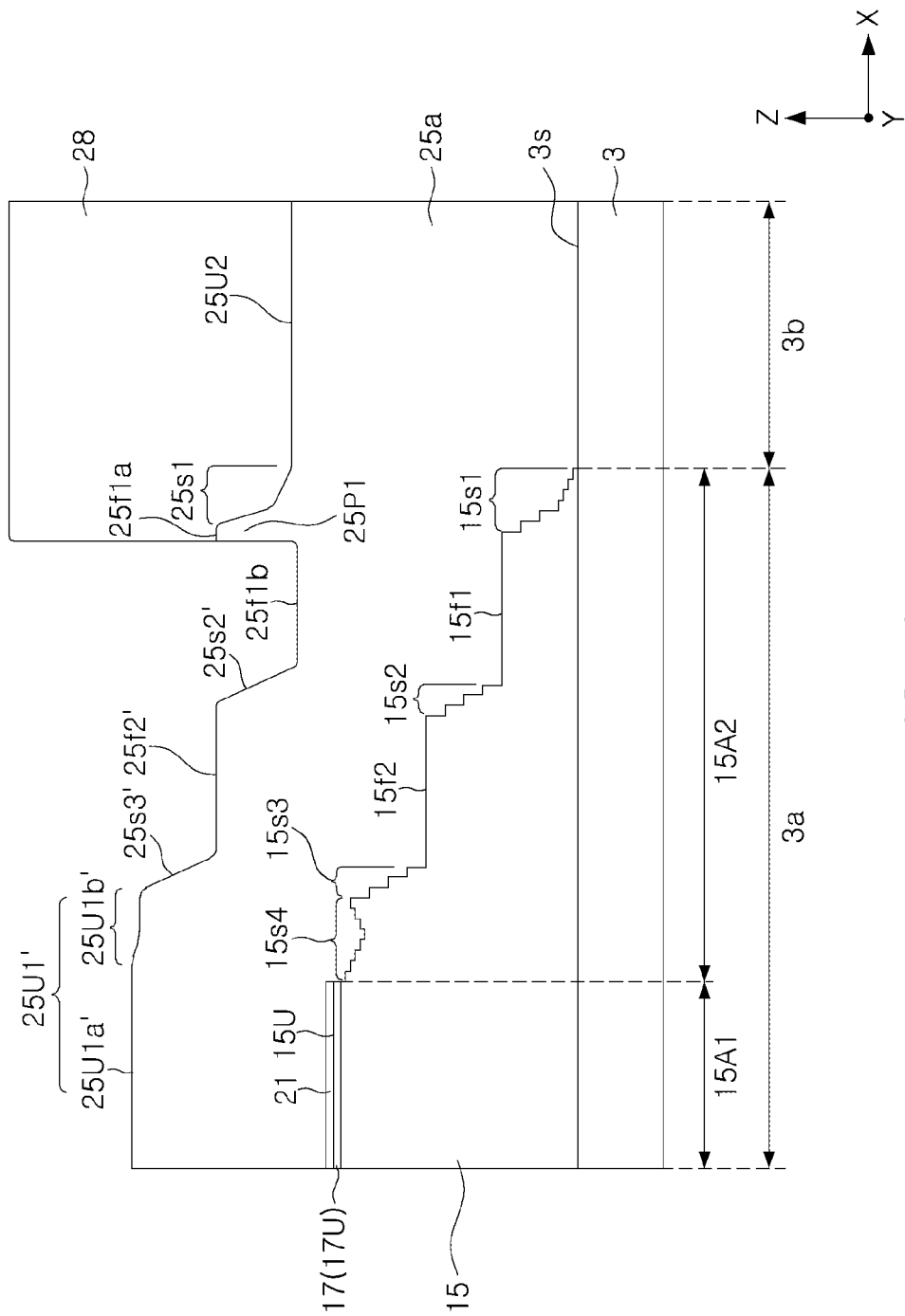

Referring to FIGS. 1A and 4, a first mask pattern 28 may be formed on the capping insulating layer 25 of FIG. 2A. The first mask pattern 28 may be, for example, a photoresist pattern.

The first mask pattern 28 may cover the second capping region 25U2 and the first inclined surface 25*s*1 of the capping insulating layer 25 (see FIG. 2A).

In some embodiments, the first mask pattern 28 may cover the first inclined surface 25*s*1 of the capping insulating layer 25 (see FIG. 2A) and may cover a portion of the first flat surface 25*f*1 (see FIG. 2A) of the capping insulating layer 25 (see FIG. 2A).

In the etching process using the first mask pattern 28 as an etching mask, the capping insulating layer 25 may be partially etched to form a first protrusion 25P1 below the first mask pattern 28. Therefore, the capping insulating layer 25*a* having the first protrusion 25P1 may be formed.

The first protrusion 25P1 may have an upper end portion 25*f*1*a* formed by remaining a portion of the first flat surface 25*f*1 of FIG. 2A and a first inclined surface 25*s*1. The remaining portion of the first flat surface 25*f*1 of FIG. 2A may be etched to form a first flat surface 25*f*1*b* having a lower level than the upper end portion 25*f*1*a* of the first protrusion 25P1. In addition, the capping insulating layer 25*a* may have a first capping region 25U1' having a height lower than that of the capping insulating layer 25 (in FIG. 2A), a third inclined surface 25*s*3', a second flat surface 25*f*2', and an intermediate inclined surface 25*s*2'. The first capping region 25U1' may include a first surface 25U1*a*' and a second surface 25U1*b*' having a lowered height.

Figure 5:
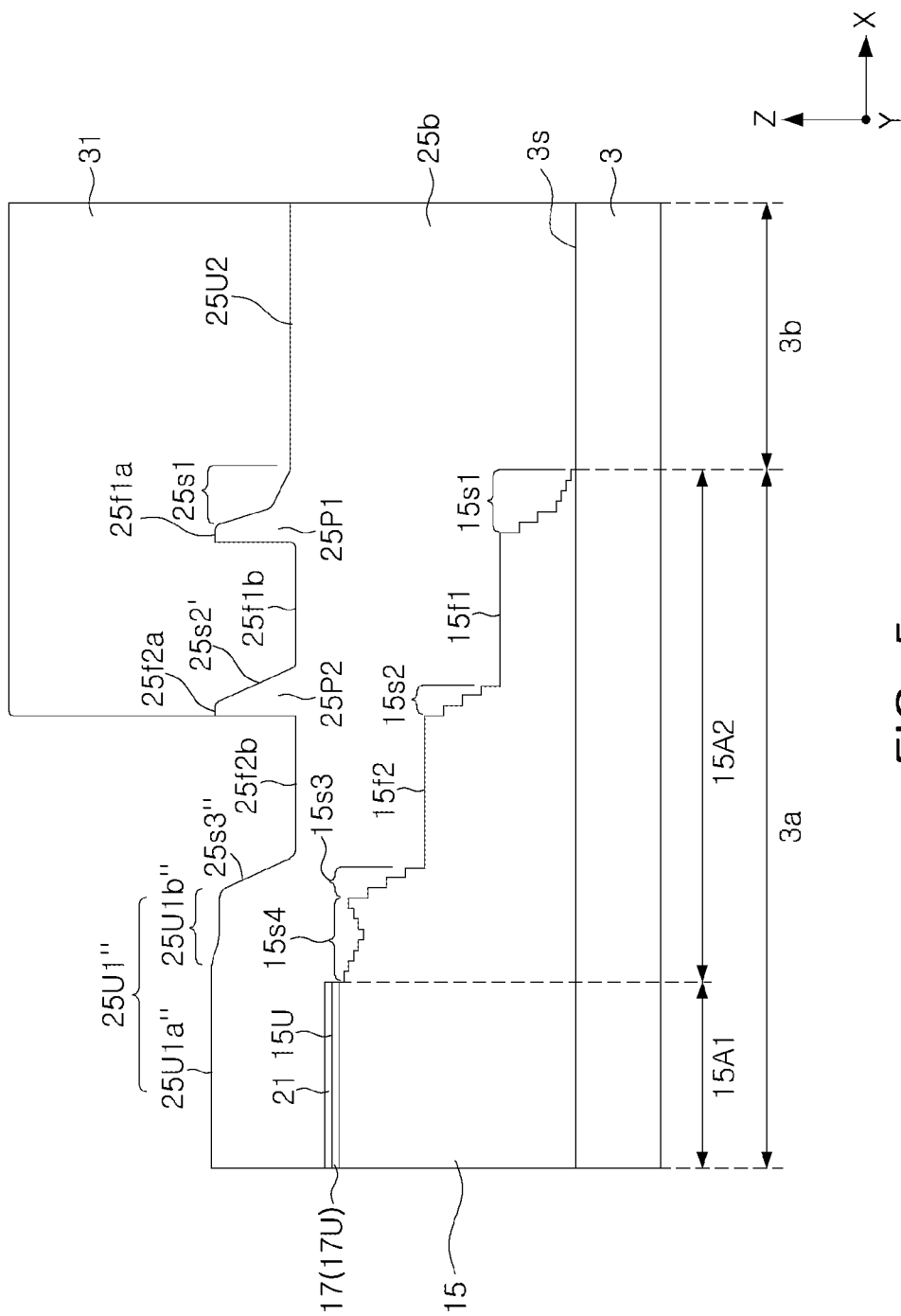

Referring to FIGS. 1A and 5, the first mask pattern 28 (see FIG. 4) may be selectively removed. A second mask pattern 31 may be formed on the capping insulating layer 25*a* of FIG. 4 having the first protrusion 25P1. The second mask pattern 31 may be, for example, a photoresist pattern. "Selectively removing an element A" (or similar language) means that the element A is removed much faster than other elements. For example, the removal rate of the element A may be at least 5 times (e.g., about 10 times, 15 times, or 20 times) the removal rate of other elements.

The second mask pattern 31 may cover the second capping region 25U2, the first protrusion 25P1, the first flat surface 25*f*1*b*, and the intermediate inclined surface 25*s*2' of the capping insulating layer 25*a* (see FIG. 4).

In some embodiments, the second mask pattern 31 may cover the intermediate inclined surface 25*s*2' of the capping insulating layer 25*a* of FIG. 4, and may cover a portion of the second flat surface 25*f*2' (see FIG. 4) of the capping insulating layer 25*a* (see FIG. 4).

In the etching process using the second mask pattern 31 as an etching mask, the capping insulating layer 25*a* of FIG. 4 may be partially etched to form a second protrusion 25P2 below the second mask pattern 31. Therefore, a capping insulating layer 25*b* having the first protrusion 25P1 and the second protrusion 25P2 may be formed.

The second protrusion 25P2 may have the intermediate inclined surface 25*s*2 intermediate and an upper end portion 25*f*2*a* formed of a remaining portion of the second flat surface 25*f*2' of FIG. 4. The remaining portion of the second flat surface (25*f*2' in FIG. 4) may be etched to form a second flat surface 25*f*2*b* having a lower level than the upper end portion 25*f*2*a* of the second protrusion 25P2.

In addition, the capping insulating layer 25*b* may include a third inclined surface 25*s*3" and a first capping region 25U1" having a height lower than that of the capping insulating layer 25 of FIG. 4. The first capping region 25U1" may include a first surface 25U1*a*" and a second surface 25U1*b*" having a relatively lowered height.

The first and second protrusions 25P1 and 25P2 may be spaced apart from each other in the first horizontal direction X.

The first and second protrusions 25P1 and 25P2 may be formed on the stepped area 15A2 of the stacked structure 15.

The first and second protrusions 25P1 and 25P2 may overlap the stepped area 15A2 of the stacked structure 15.

Figure 6:
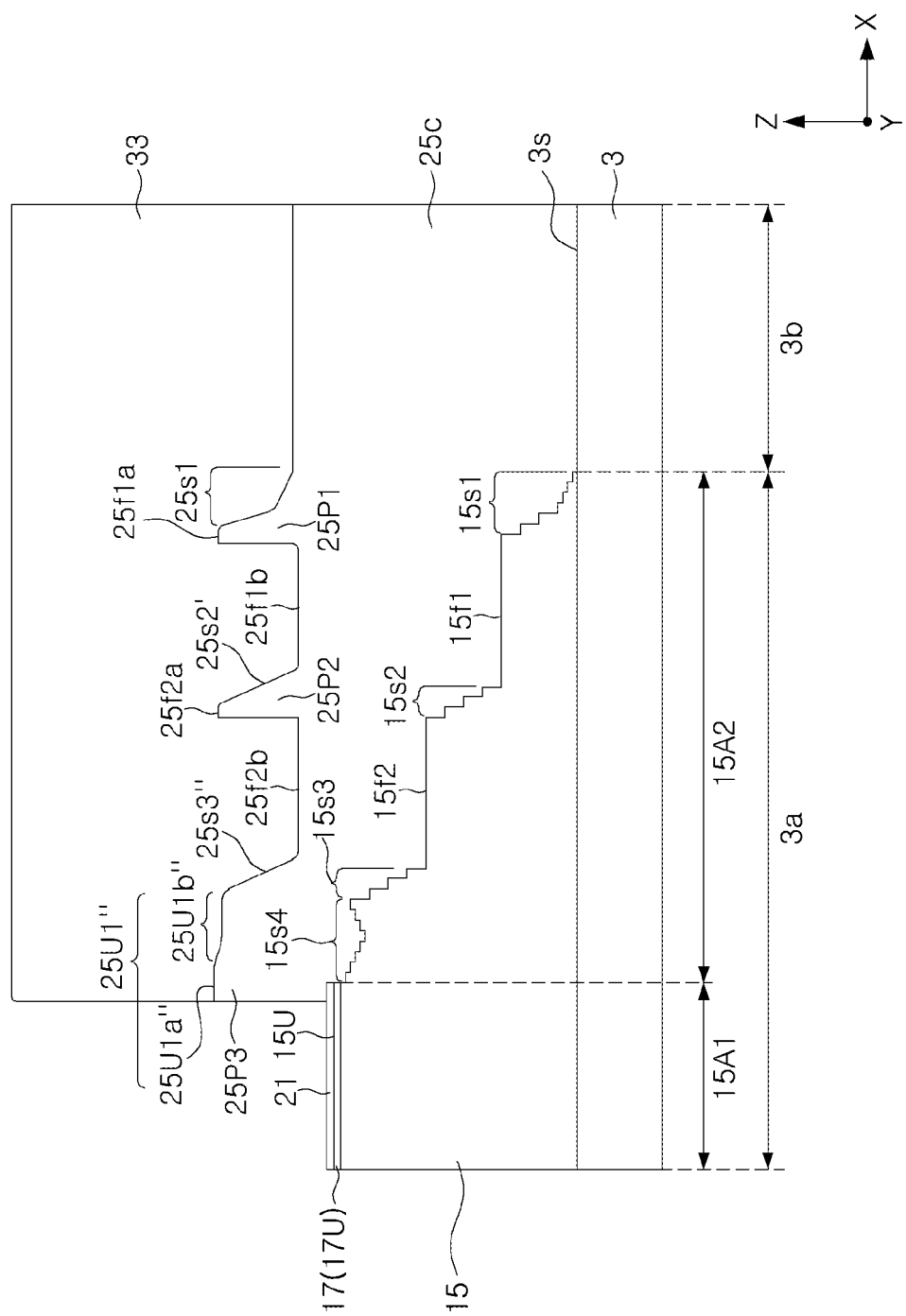

Referring to FIGS. 1A and 6, the second mask pattern 31 of FIG. 5 may be selectively removed. A third mask pattern 33 may be formed on the capping insulating layer 25b of FIG. 5 having the first and second protrusions 25P1 and 25P2. The third mask pattern 33 may be, for example, a photoresist pattern.

The third mask pattern 33 may cover the second capping region 25U2, the first protrusion 25P1, the first flat surface 25f1b, the second protrusion 25P2, the third inclined surface 25s3″, and a portion of the first capping region 25U1″ of the capping insulating layer 25b (see FIG. 5).

In the etching process using the third mask pattern 33 as an etching mask, the capping insulating layer 25b of FIG. 5 is partially etched to form a third protrusion 25P3 below the third mask pattern 33. Therefore, a capping insulating layer 25c having the first to third protrusions 25P1, 25P2, and 25P3 may be formed.

At least one of the first to third protrusions 25P1, 25P2, and 25P3 includes sides opposing each other and having different inclinations, and a side closer to the stacking area 15A1 among the sides having different inclinations may be steeper than a side farther from the stacking area 15A1. In some embodiments, each of the first to third protrusions 25P1, 25P2, and 25P3 may include opposing sides, and one of the opposing sides closer to the stacking area 15A1 may be perpendicular to the upper surface 3s of the substrate 3 as illustrated in FIG. 6. In some embodiments, the first flat surface 25f1b that is between the first protrusion 25P1 and the second protrusion 25P2 and the second flat surface 25f2b that is between the second protrusion 25P2 and the third protrusion 25P3 may be at the equal level as illustrated in FIG. 6.

The third protrusion 25P3 may have an upper end portion formed of a remaining portion of the first capping region 25U1″ of FIG. 5, and the third inclined surface 25s3″. In the third protrusion 25P3, the upper end portion formed as a portion of the first capping region (25U1″ in FIG. 5) remains may include a portion of the first surface 25U1a″, and the second surface 25U1b″.

Figure 7:
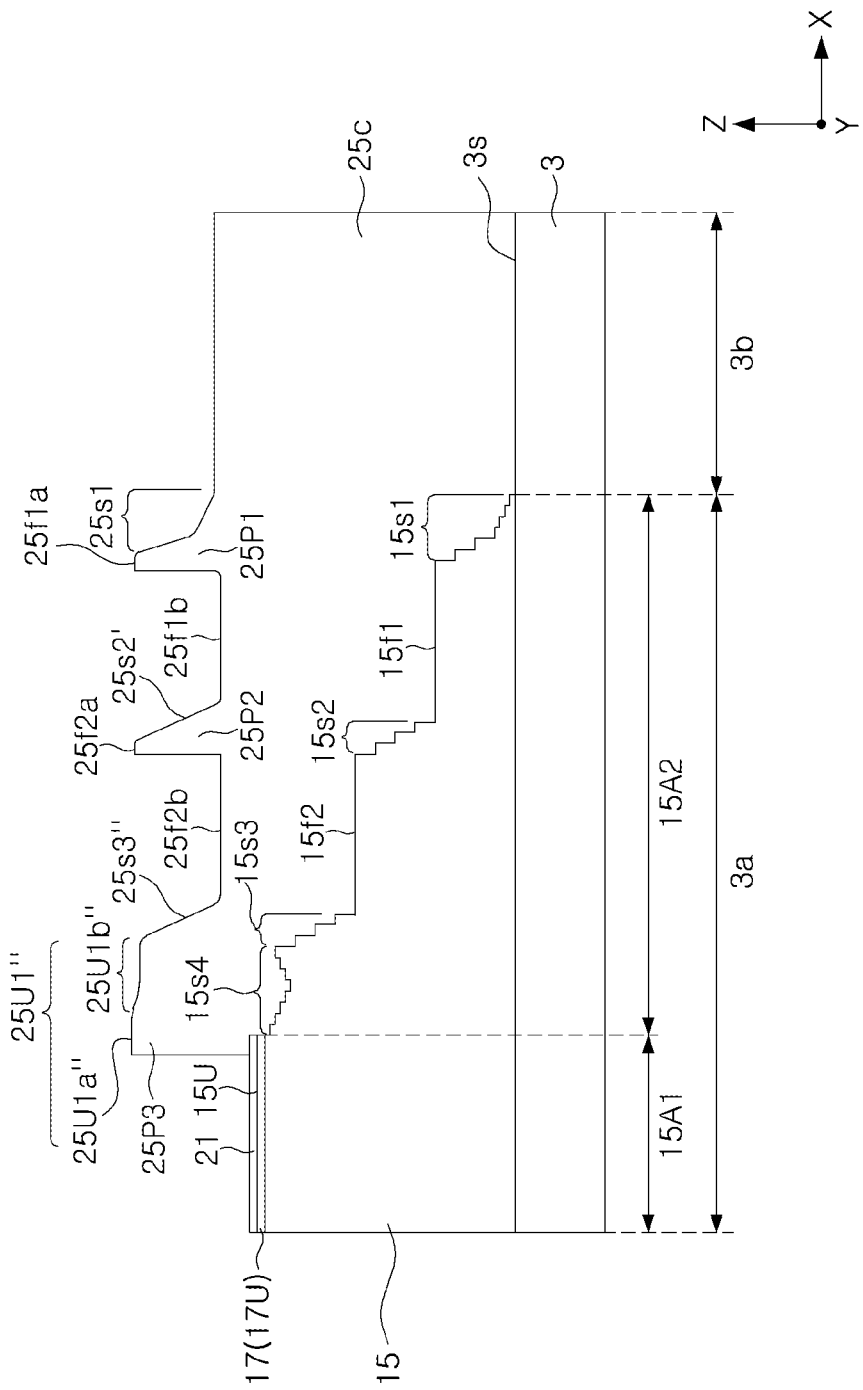

Referring to FIGS. 1A and 7, the third mask pattern 33 of FIG. 6 may be selectively removed. Therefore, the capping insulating layer 25c having the first to third protrusions 25P1, 25P2, and 25P3 may be formed.

The first to third protrusions 25P1, 25P2, and 25P3 may be spaced apart from each other in the first horizontal direction X.

At the same height level, the length of any one of the first to third protrusions 25P1, 25P2, and 25P3 in the first horizontal direction X may be greater than the length of the remaining protrusions in the first horizontal direction X. For example, at the same height level, the length of the third protrusion 25P3 in the first horizontal direction X may be greater than the length of each of the first and second protrusions 25P1 and 25P2 in the first horizontal direction X.

Although forming of the three protrusions (e.g., first to third protrusions 25P1, 25P2 and 25P3) is described, the present inventive concept is not limited thereto. For example, according to embodiments thereof, only two protrusions among the first to third protrusions 25P1, 25P2, and 25P3 may also be formed.

In some embodiments, four or more protrusions may be formed depending on the step shape of the stacked structure 15. For example, in the case in which the number of flat areas 15f1 and 15f2 of the stacked structure 15 described with reference to FIG. 2A increases, the number of protrusions of the capping insulating layer 25c may increase.

Figure 8:
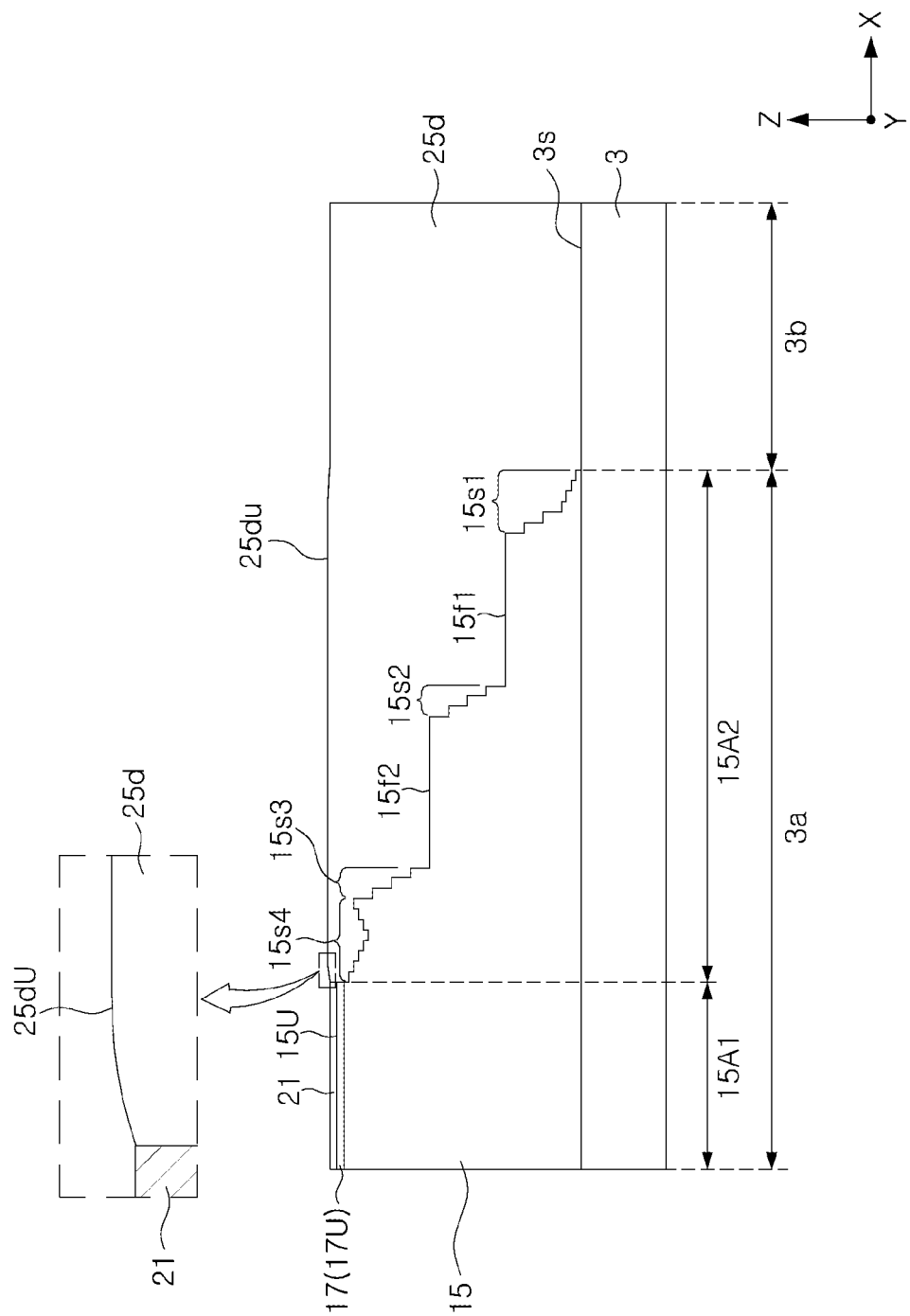

Referring to FIGS. 1A and 8, the capping insulating layer on which the plurality of protrusions are formed may be planarized by using a chemical mechanical polishing process (S20). Thus, the planarized capping insulating layer 25d may be formed. In this case, the plurality of protrusions may be the first to third protrusions 25P1, 25P2, and 25P3 of FIG. 7. As the planarized capping insulating layer 25d is formed, the first to third protrusions 25P1, 25P2, and 25P3 of FIG. 7 may be removed.

The planarized capping insulating layer 25d may be formed to have an upper surface 25du positioned on a level higher than the upper surface of the planarization stop layer 21.

Figure 9A:
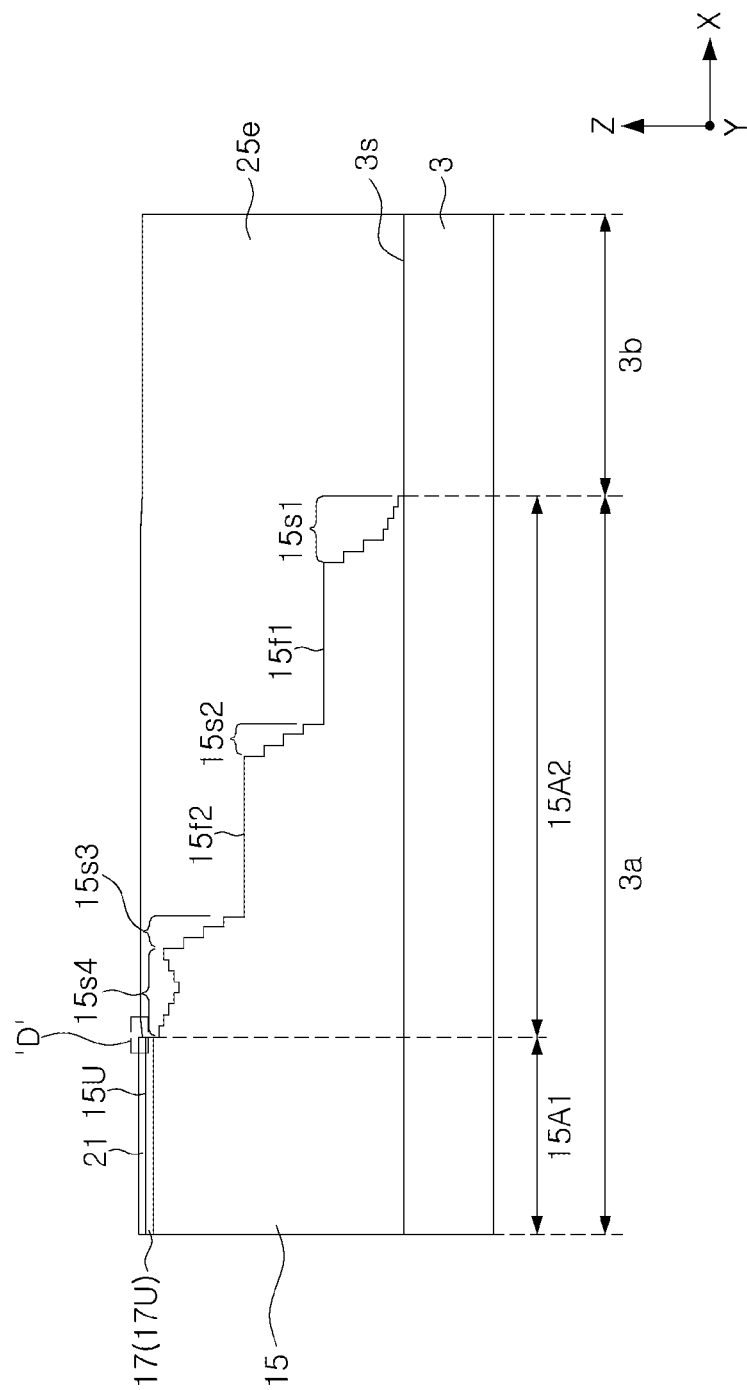
Figure 9B:
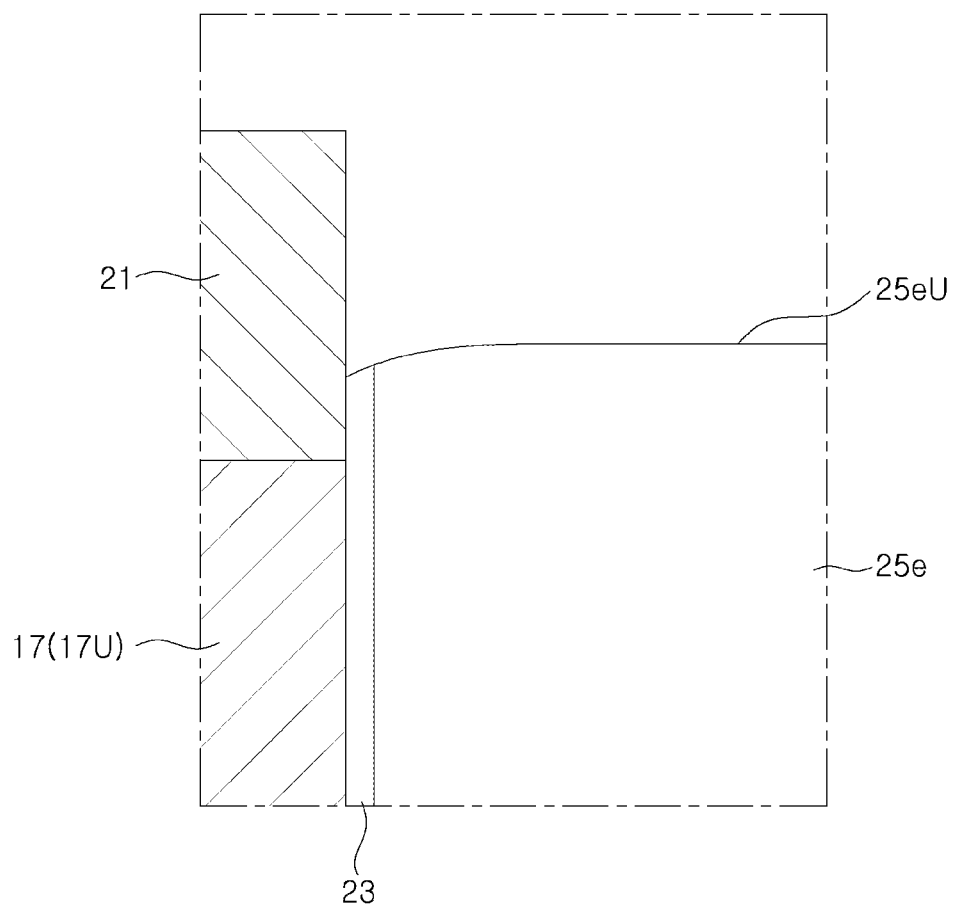
Figure 9C:
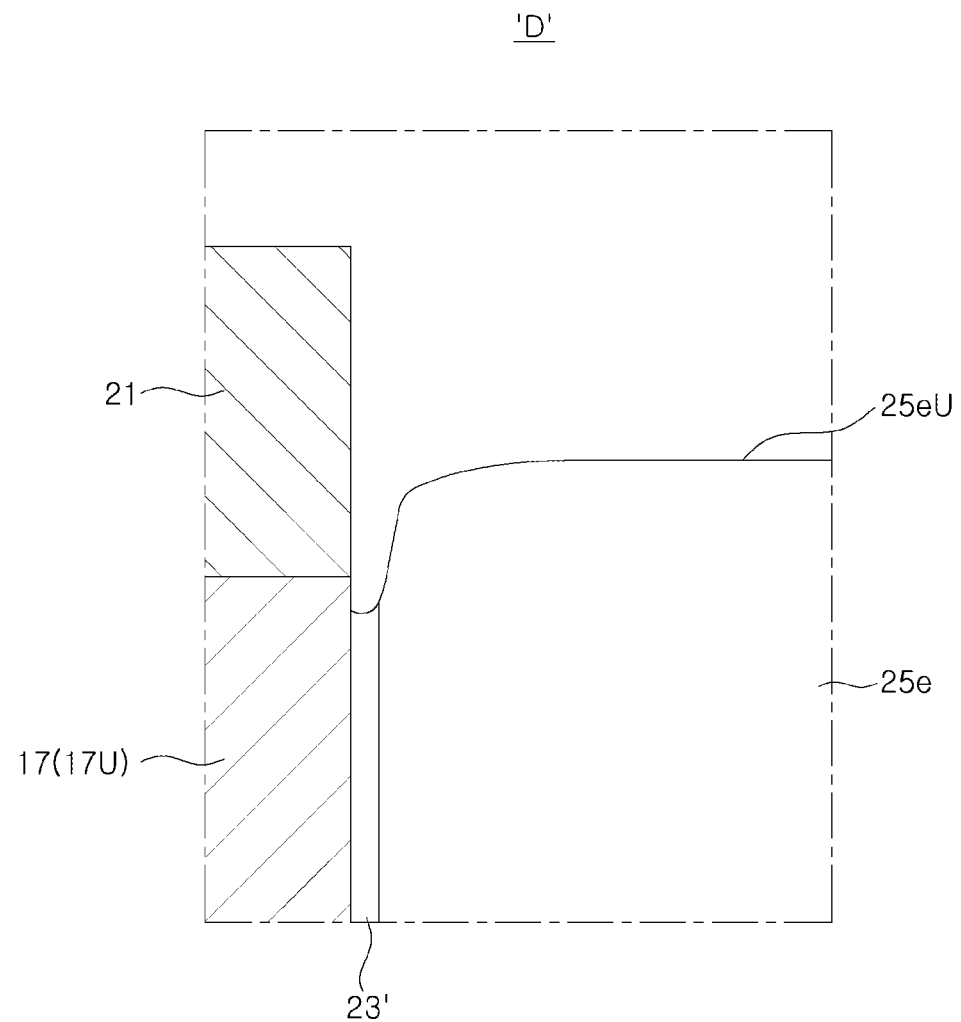
Figure 10B:
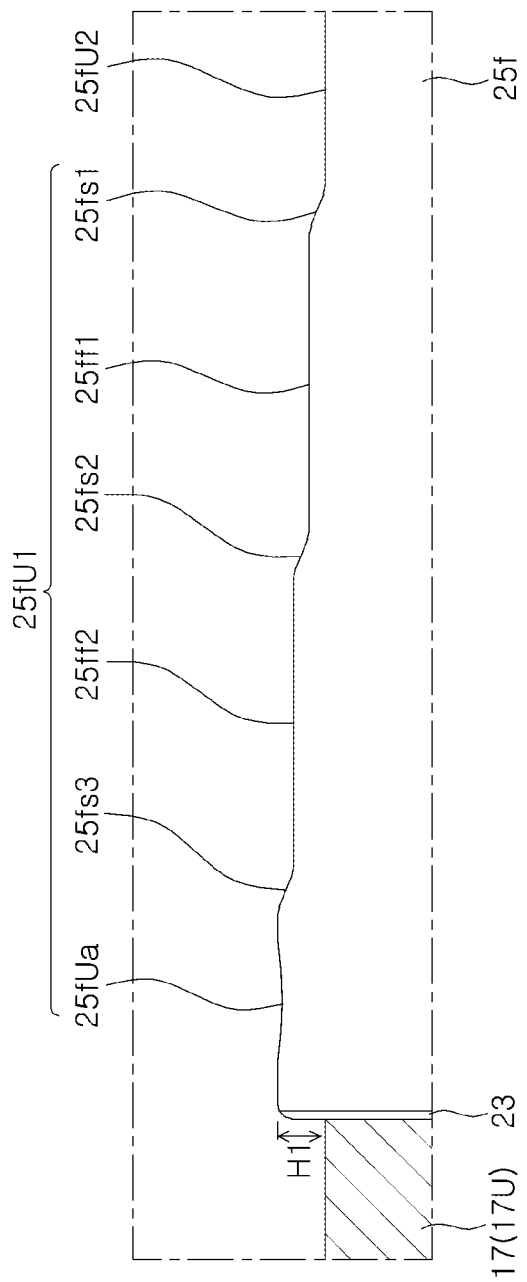

Referring to FIGS. 1A, 9A, and 9B, the planarized capping insulating layer (25d of FIG. 8) may be partially etched (S25). Thus, the partially etched capping insulating layer 25e may be formed. The upper surface 25eU of the partially etched capping insulating layer 25e may be located on a level lower than the upper surface of the planarization stop layer 21, and may be located on a level higher than the lower surface of the planarization stop layer 21. As used herein, "an a surface A lower than a surface B" (or similar language) means that a distance from the upper surface 3s of the substrate 3 to the surface A in the vertical direction Z is shorter than a distance from the upper surface 3s of the substrate 3 to the surface A in the vertical direction Z.

In some embodiments, while partially etching the planarized capping insulating layer (25d of FIG. 8), the buffer insulating layer 23 described above with reference to FIGS. 2B to 2D may also partially be etched.

Etch rates for the planarized capping insulating layer (25d of FIG. 8) and the buffer insulating layer (23 of FIGS. 2B to 2D) may be substantially the same or similar. For example, the planarized capping insulating layer 25d of FIG. 8 and the buffer insulating layer 23 of FIG. 2B to 2D may be partially etched in a dry etching process. The partially etched buffer insulating layer 23 and the partially etched capping insulating layer 25e may have top surfaces extending continuously as illustrated in FIG. 9B.

In some embodiments, the planarized capping insulating layer 25d of FIG. 8 and the buffer insulating layer 23 may be partially etched by using etching processes having different etching rates from each other, for example, a wet etching process. As such, an example in which the planarized capping insulating layer (25d of FIG. 8) and the buffer insulating layer 23 are partially etched using an etching process having a different etching rate, for example, a wet etching process will be described with reference to FIG. 9C.

Referring to FIG. 9C, an etching process having a different etching rate for the planarized capping insulating layer 25d of FIG. 8 and the buffer insulating layer 23 of FIGS. 2B to 2D may be used, for example, using a wet etching process, thereby partially etching the planarized capping insulating layer 25d of FIG. 8 and the buffer insulating layer 23 of FIG. 2B to 2D. Thus, the upper surface of a partially etched buffer insulating layer 23' may be formed on a level lower than the upper surface of the partially etched capping insulating layer 25e.

Hereinafter, as described in FIG. 9B, the partially etched buffer insulating layer 23 and the partially etched capping insulating layer 25e formed by partially etching the planarized capping insulating layer (25d of FIG. 8) and the buffer insulating layer (23 of FIGS. 2B to 2D), using the etching process having substantially the same or similar etching rates for the planarized capping insulating layer (25*d* in FIG. 8) and the buffer insulating layer (23 in FIGS. 2B to 2D), will be mainly described.

Referring to FIGS. 1A, 10A, and 10B, the planarization stop layer (21 of FIGS. 9A and 9B) may be selectively removed. An annealing process 35 may proceed (S35).

For example, the annealing process 35 may be performed at a temperature of about 500° C. to about 850° C.

For example, the annealing process 35 may be performed for approximately 30 minutes to 2 hours.

The annealing process 35 may increase the density of the partially etched capping insulating layer (25*e* in FIGS. 9A and 9B) to form a densified capping insulating layer 25*f*. The annealing process 35 may reduce the volume of the partially etched capping insulating layer (25*e* of FIGS. 9A and 9B).

For convenience of description below, the densified capping insulating layer 25*f* will be described with the term "capping insulating layer".

By the annealing process 35, an upper surface 25*f*U of the capping insulating layer 25*f* may be formed to have a first surface 25*f*U1 and a second surface 25*f*U2 at a lower level than the first surface 25*f*U1.

An uppermost end 25*f*Ua of the first surface 25 fU1 may be higher by a first height H1 than the upper surface of the first uppermost layer 17U of the stacked structure 15.

For example, the first height H1 may be less than the thickness of each of the plurality of second layers 19 of FIG. 2B.

The second surface 25*f*U2 of the upper surface 25*f*U of the capping insulating layer 25*f* may be formed to have a height level substantially the same as that of the upper surface of the first uppermost layer 17U.

On the upper surface 25*f*U of the capping insulating layer 25*f*, the first surface 25*f*U1 may include an upper portion 25*f*Ua, an upper inclined portion 25*fs*3, an upper flat portion 25*ff*2, an intermediate inclined portion 25*fs*2, a lower flat portion 25*ff*1, and a lower inclined portion 25*fs*1, sequentially arranged in the first horizontal direction X.

In some embodiments, the lower flat portion 25*ff*1 may be formed at a lower level than the upper flat portion 25*ff*2.

In some embodiments, the buffer insulating layer 23 disposed between the stacked structure 15 and the capping insulating layer 25*f* may extend on the side of the capping insulating layer 25*f* disposed on a level higher than that of the stacked structure 15.

In some embodiments, referring to FIG. 10C, an upper surface of the buffer insulating layer 23' disposed between the stacked structure 15 and the capping insulating layer 25*f* may be formed on a level lower than the first uppermost layer 17U of the stacked structure 15.

Figure 11A:
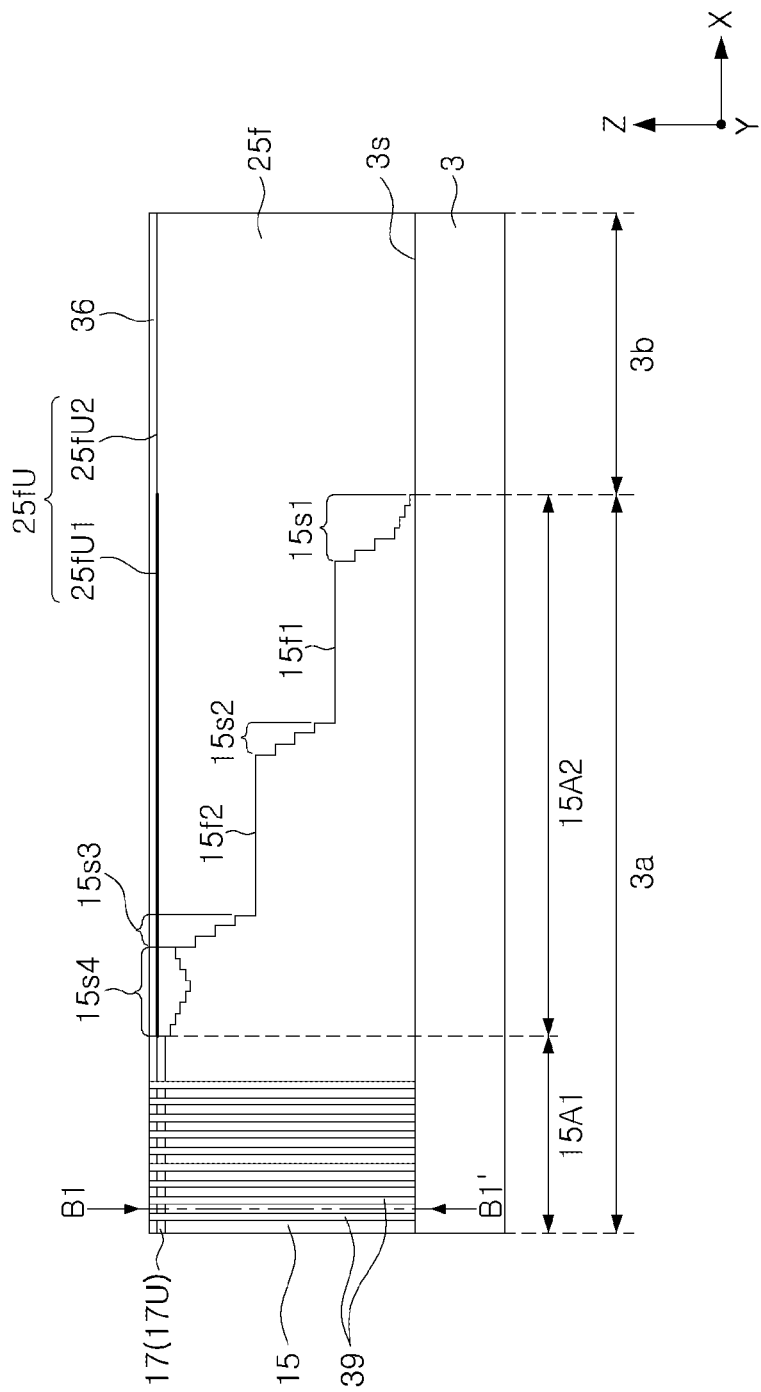
Figure 11B:
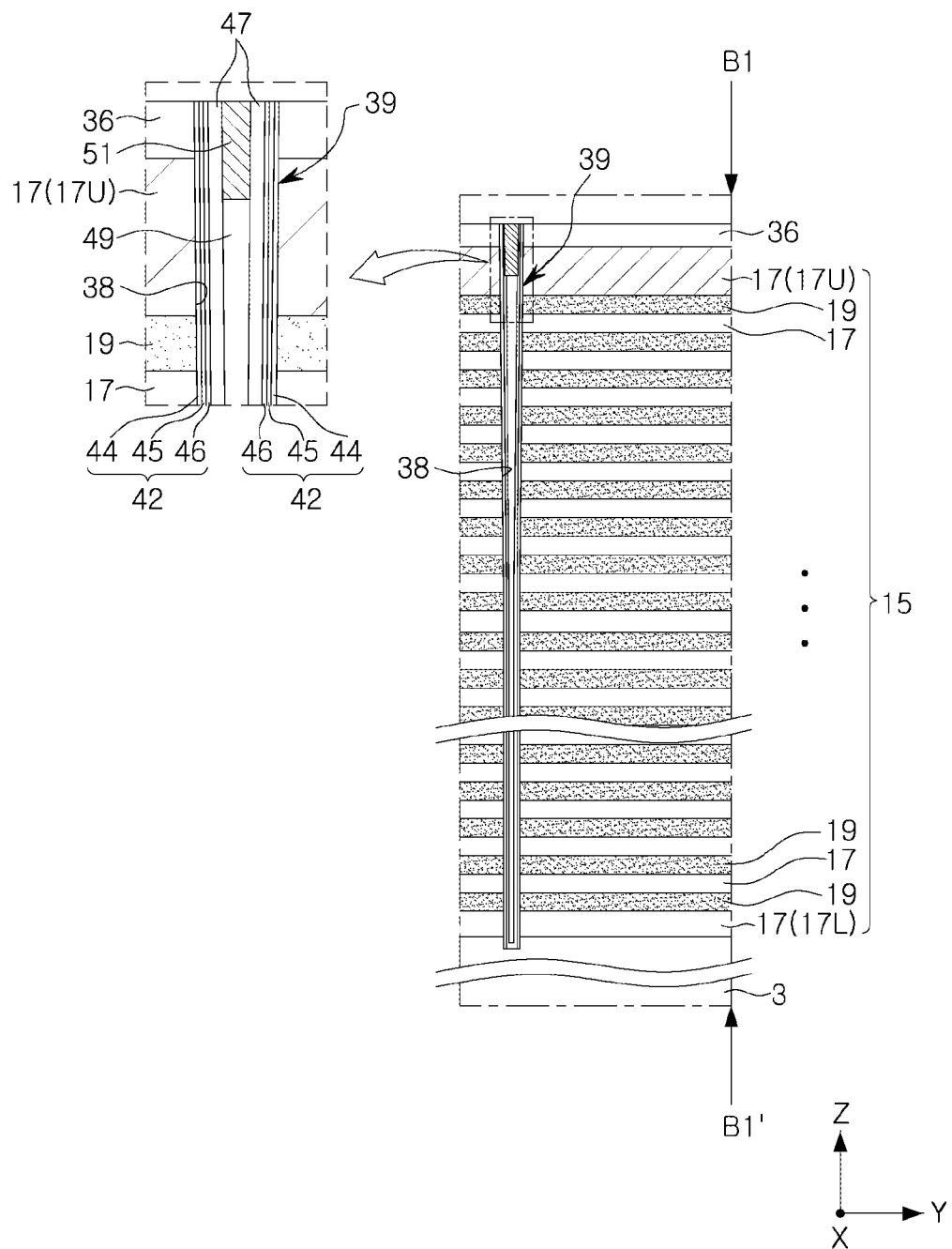
Figure 12A:
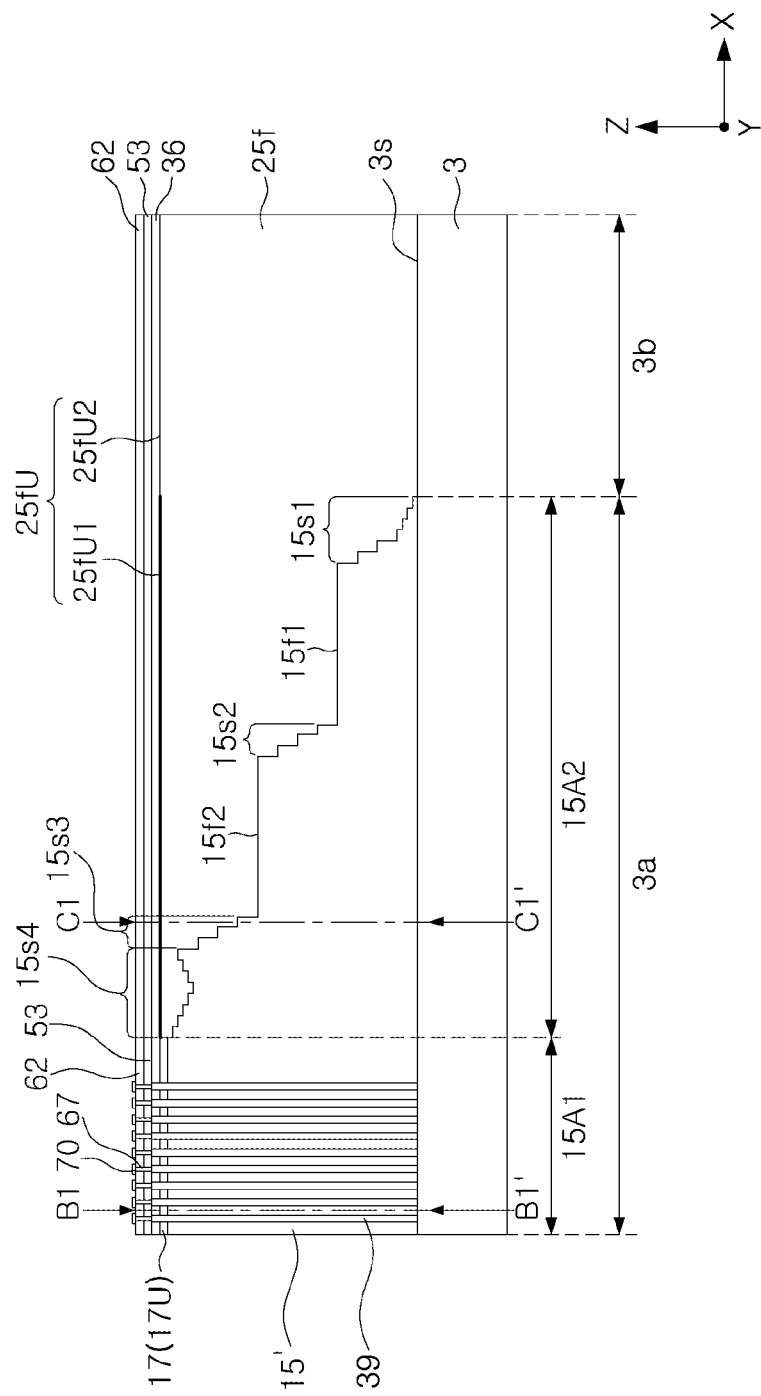
Figure 12B:
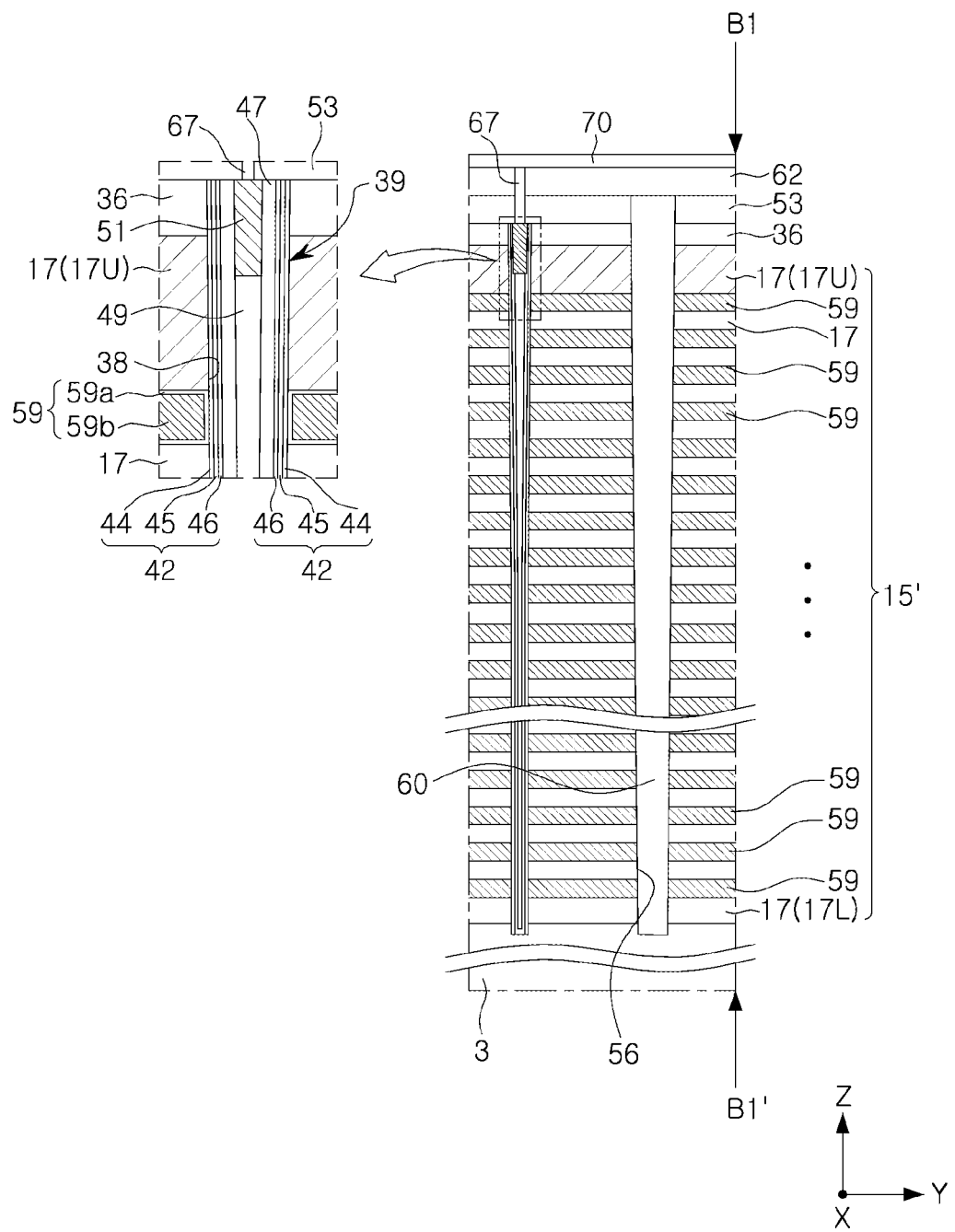
Figure 12C:
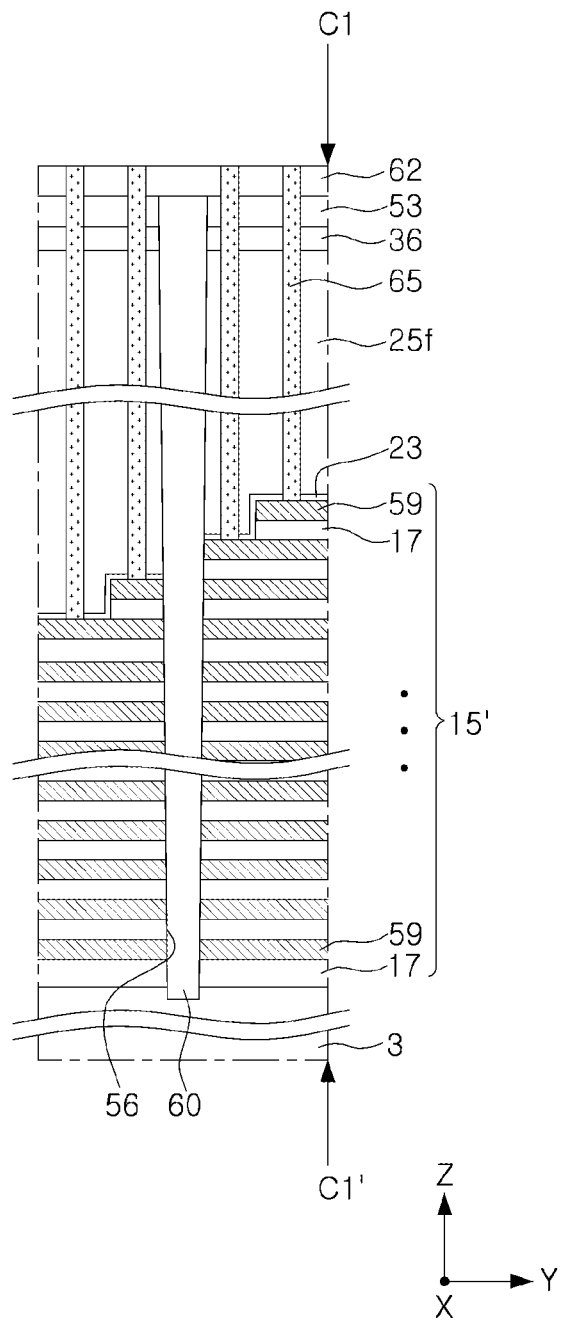

Referring to FIGS. 1B, 11A, and 11B, a first upper insulating layer 36 may be formed on the stacked structure 15 and the capping insulating layer 25*f*. The first upper insulating layer 36 may be formed of silicon oxide.

A channel hole 38 may be formed (S40). The channel hole 38 may penetrate through the first upper insulating layer 36 and the stacked structure 15.

A vertical memory structure 39 may include a core region 49, a pad pattern 51 on an upper surface of the core region 49, a channel semiconductor layer 47 covering side and lower surfaces of the core region 49 and in contact with the pad pattern 51, and a dielectric structure 42 surrounding the outer side surface of the channel semiconductor layer 47.

The dielectric structure 42 may include a first dielectric layer 44, a second dielectric layer 46, and a data storage layer 45 between the first dielectric layer 44 and the second dielectric layer 46. The first dielectric layer 44 may be disposed between the data storage layer 45 and the stacked structure 15, and the second dielectric layer 46 may be disposed between the data storage layer 45 and the channel semiconductor layer 47. The data storage layer 45 may be a charge trap layer formed of silicon nitride or the like. The data storage layer 45 may include regions capable of storing data in a semiconductor device such as a vertical NAND flash memory device.

Referring to FIGS. 1B, 12A, 12B, and 12C, a second upper insulating layer 53 may be formed on the first upper insulating layer 36. A separation trench 56 may be formed (S50).

The second layers (19 of FIG. 11B) of the stacked structure (15 of FIG. 11B) exposed by the separation trench 56 may be replaced with gate layers 59 (S55). Thus, a stacked structure 15' including the plurality of first layers 17 and the gate layers 59 may be formed.

Each of the gate layers 59 may include a first material layer 59*a* and a second material layer 59*b*. The first material layer 59*a* may cover the upper and lower surfaces of the second material layer 59*b* and may extend between the second material layer 59*b* and the vertical memory structure 39.

In some embodiments, the first material layer 59*a* may be formed of a first conductivity-type material (e.g., TiN, etc.), and the second material layer 59*b* may be formed of a second conductivity-type material (e.g., W, etc.) different from the first conductivity-type material.

In some embodiments, the first material layer 59*a* may be formed of an insulating material, and the second material layer 59*b* may be formed of a conductive material.

A separation structure 60 may be formed in the separation trench 56 (S60).

In some embodiments, the separation structure 60 may be formed of an insulating material.

In some embodiments, the separation structure 60 may be formed of multiple material layers, for example, a conductive material layer and an insulating material layer surrounding the side of the conductive material layer.

A third upper insulating layer 62 may be formed on the second upper insulating layer 53.

On the stacking area 15A1 of the stacked structure 15', the third upper insulating layer 62, and a bit line contact plug 67 penetrating through the second upper insulating layer 53 and being electrically connected to the vertical memory structure 39, may be formed. A bit line 70 may be formed on the bit line contact plug 67.

On the stepped area 15A2 of the stacked structure 15', the third upper insulating layer 62, the second upper insulating layer 53, the first upper insulating layer 36, and gate contact plugs 65 (see FIG. 12C) penetrating through the capping insulating layer 25*f* and being electrically connected to the gate layers 59, may be formed. The gate contact plugs 65 of FIG. 12C may be viewed in cross section as illustrated in FIG. 12C, or may not be illustrated in cross-section as in FIG. 12A, depending on the position at which the stacked structure 15' is cut.

The semiconductor device may be formed by the method described above with reference to FIGS. 1A through 12C. The semiconductor device thus formed may be formed to have a structure as illustrated in FIGS. 12A to 12C. In some embodiments, a semiconductor device formed by a method of forming a semiconductor device according to embodiments of the present inventive concept may include the stacked structure 15' having the stacking area 15A1 and the stepped area 15A2, and the buffer insulating layer 23 and the capping insulating layer 25*f* as described with reference to FIG. 10A and FIG. 10B. In some embodiments, the semiconductor device may include the buffer insulating layer 23' as described with reference to FIG. 10C. Accordingly, as described above with reference to FIGS. 1A through 12C, the semiconductor device may include the components formed by the method of forming the semiconductor device described above with reference to FIGS. 1A through 12C. Therefore, detailed description of the structure of the semiconductor device will be omitted herein.

Figure 13A:
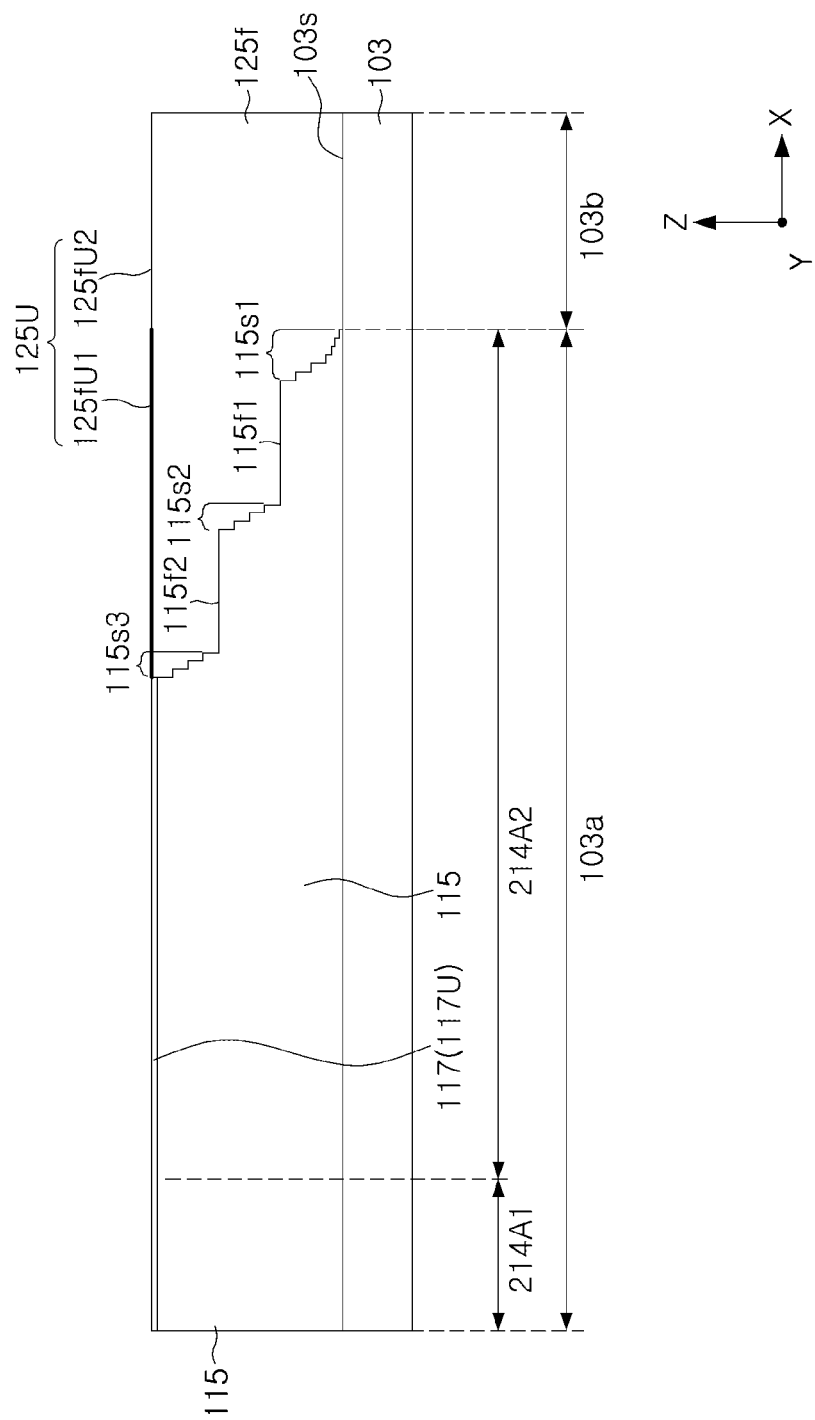
FIGS. 13A to 15B are diagrams illustrating a method of forming a semiconductor device according to example embodiments of the present inventive concept.
Figure 13B:
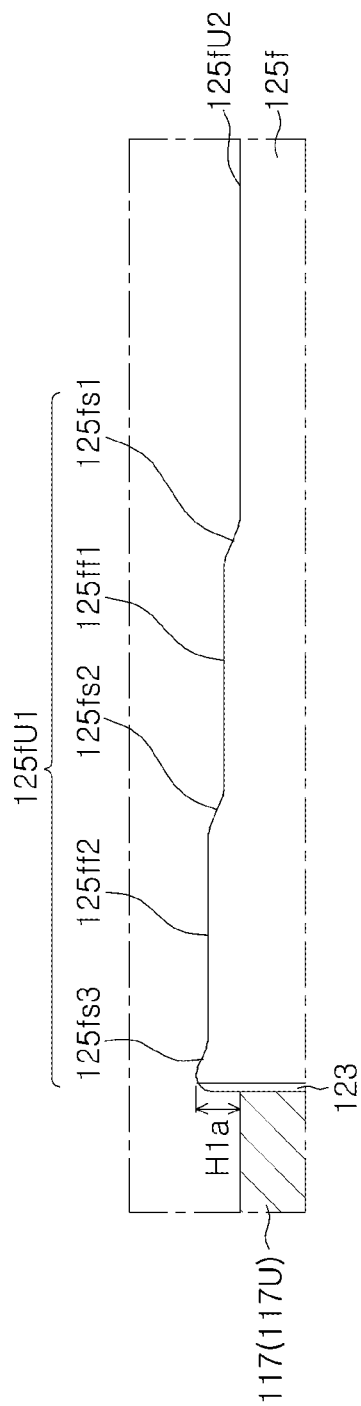
Figure 13C:
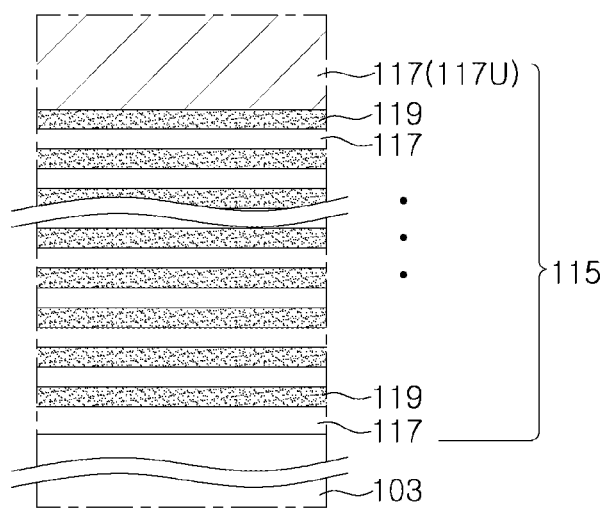
Figure 14A:
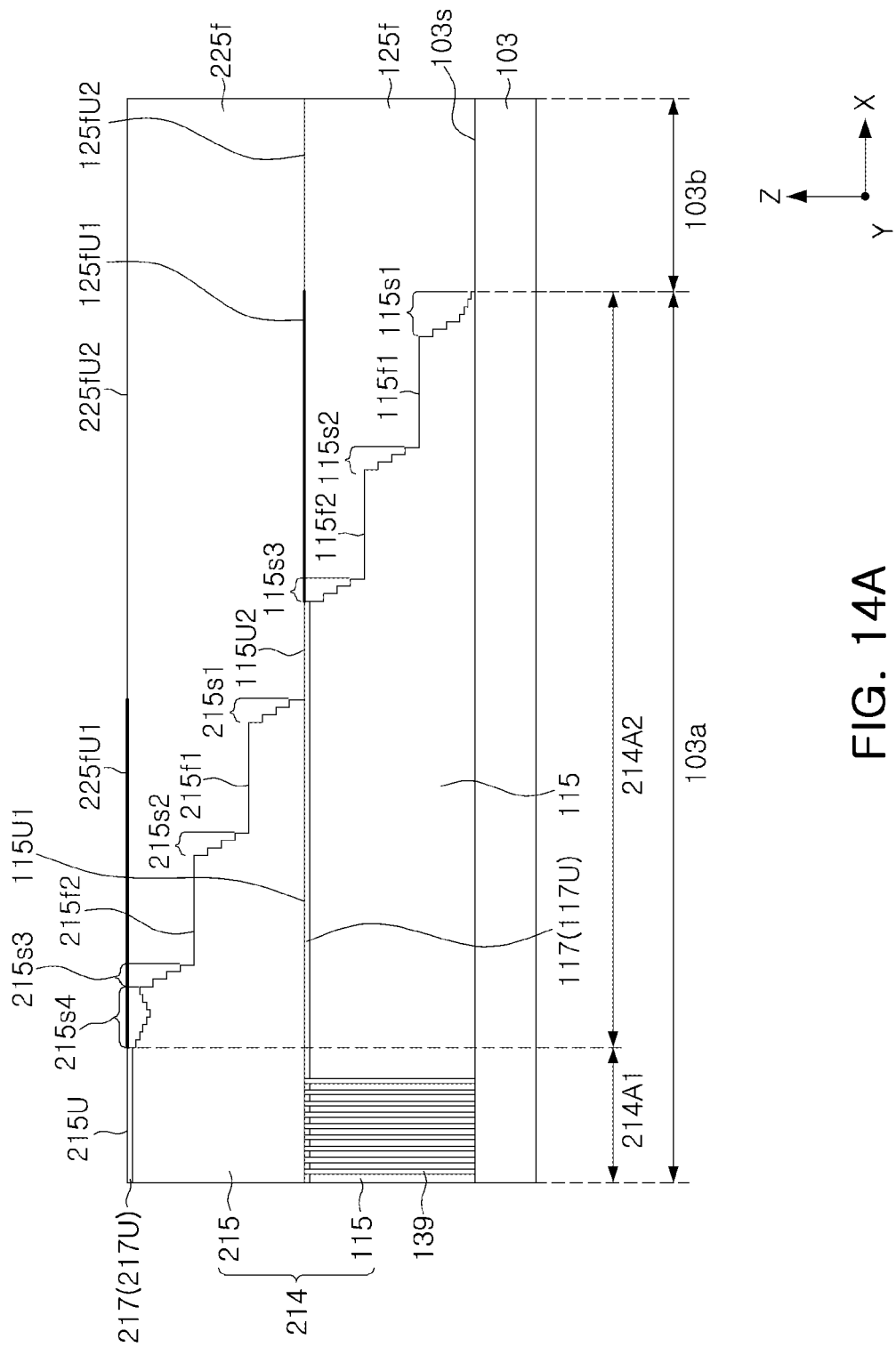
Figure 14B:
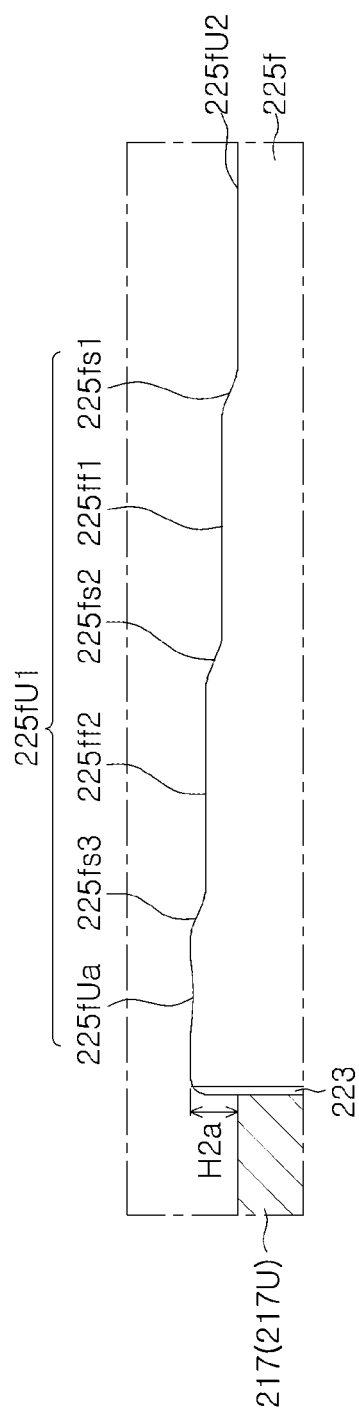
Figure 15A:
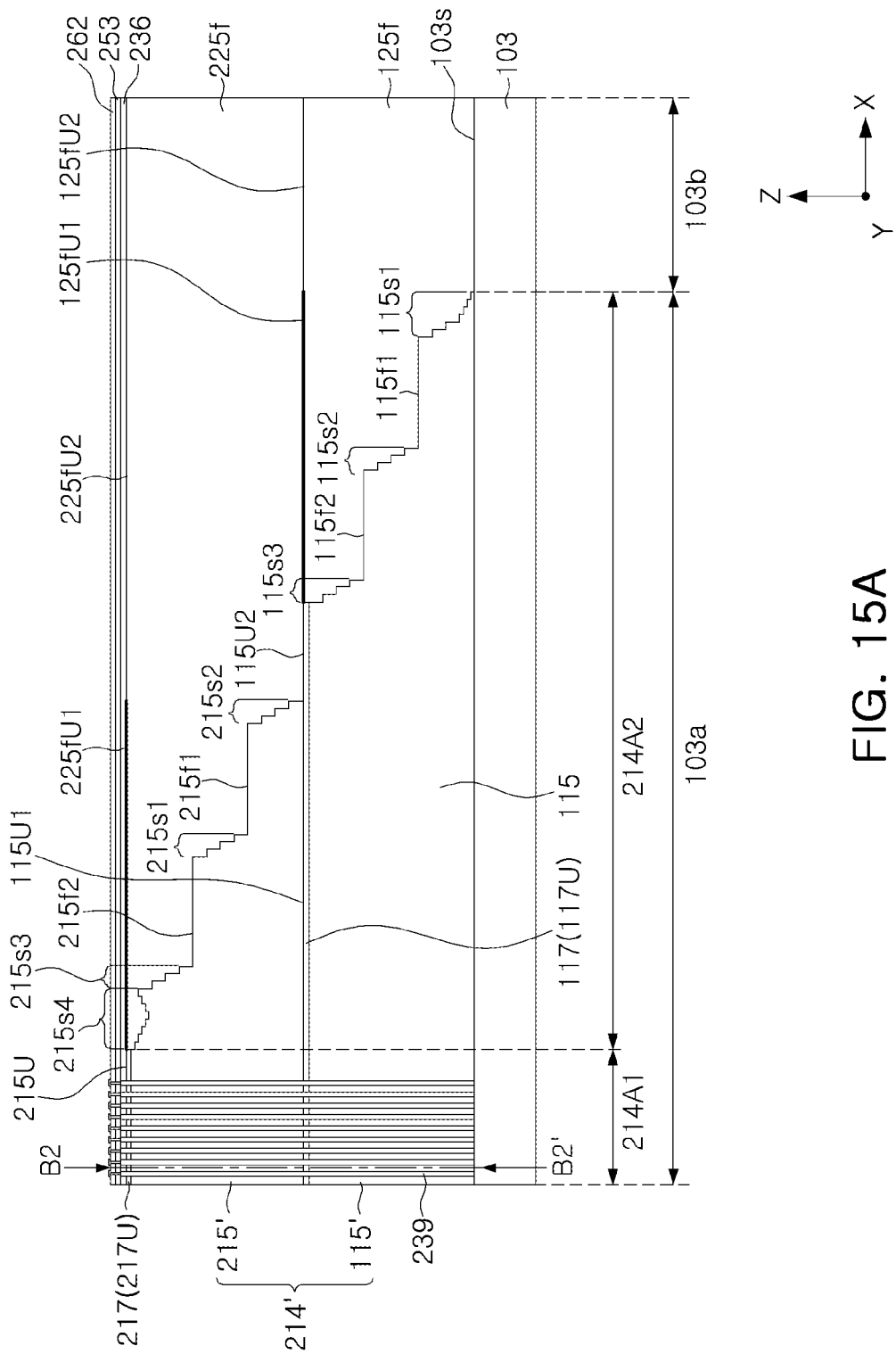
Figure 15B:
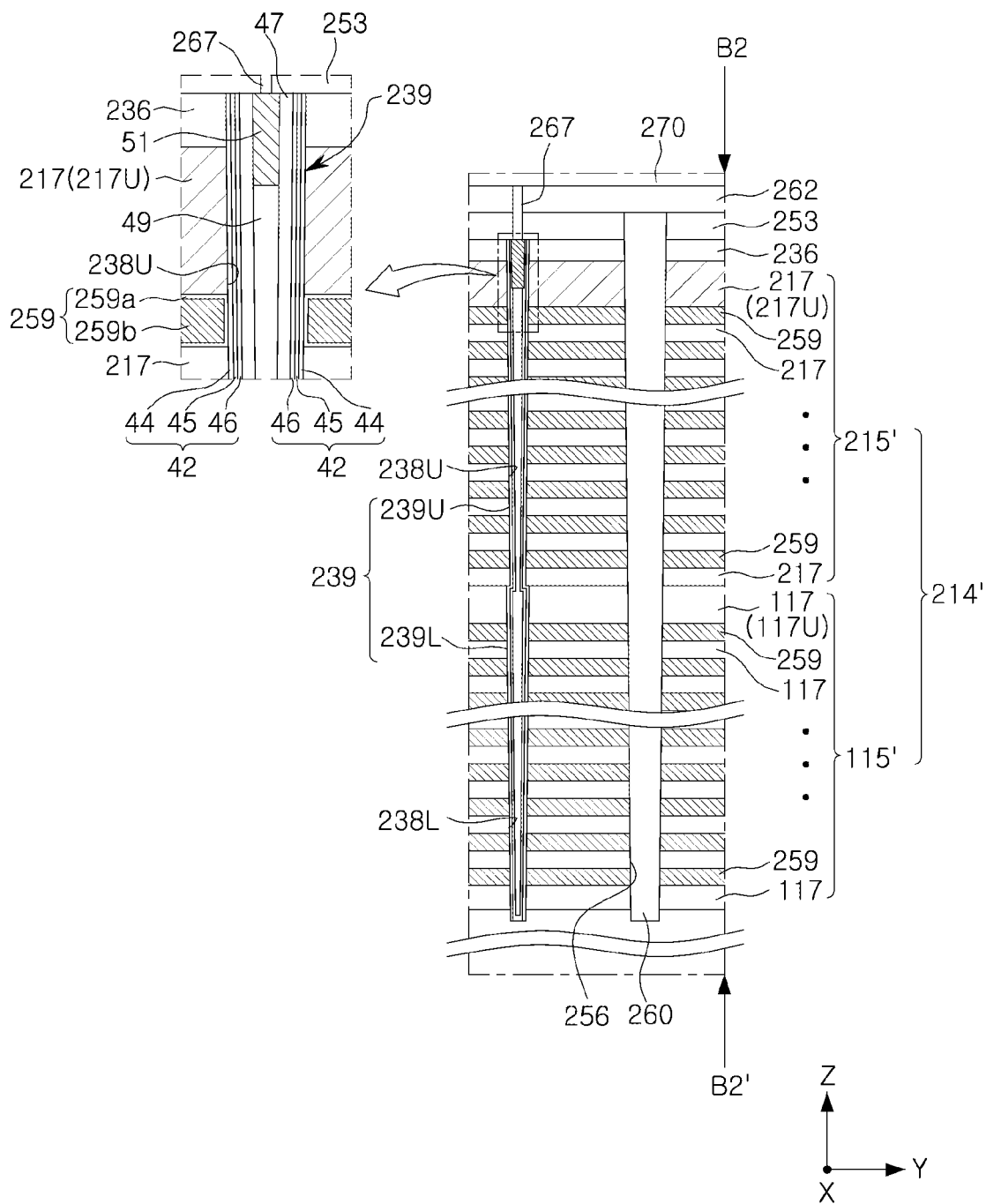

Next, a method of forming a semiconductor device according to some embodiments of the present inventive concept will be described with reference to FIGS. 13A through 15B. FIGS. 13A, 14A, and 15A are cross-sectional views taken along the first horizontal direction to illustrate a method of forming a semiconductor device according to example embodiments. FIG. 13B is an enlarged cross-sectional view illustrating an upper surface of a lower capping insulating layer of FIG. 13A. FIG. 13C is an enlarged cross-sectional view illustrating a lower stacked structure. FIG. 14B is an enlarged cross-sectional view of a portion of FIG. 14A. FIG. 15B is an enlarged cross-sectional view of a portion indicated by line B2-B2' of FIG. 15A taken along a second horizontal direction.

Referring to FIGS. 13A, 13B, and 13C, a substrate 103 may be prepared. The substrate 103 may be the substrate 3 (see FIG. 2A) described with reference to FIG. 2A or may be the substrate 3' (see FIG. 3) described above with reference to FIG. 3.

A lower stacked structure 115 may be formed on a first region 103a of the substrate 103. The lower stacked structure 115 may include a plurality of first lower layers 117 and a plurality of second lower layers 119 that are alternately repeatedly stacked. The plurality of first lower layers 117 and the plurality of second lower layers 119 may correspond to, respectively, the plurality of first layers (17 of FIGS. 2B to 2D) and the plurality of second layers (19 of FIGS. 2B to 2D) described with reference to FIGS. 2B to 2D. Therefore, an uppermost layer 117U of the plurality of first lower layers 117 and the plurality of second lower layers 119 may be the first lower layer 117.

The lower stacked structure 115 may include stepped areas 115s1, 115f1, 115s2, 115f2, and 115s3. In the lower stacked structure 115, an area other than the stepped areas 115s1, 115f1, 115s2, 115f2, and 115s3 may be defined as a stacking area. The stepped areas 115s1, 115f1, 115s2, 115f2 and 115s3 of the lower stacked structure 115 may include a first lower inclined stepped area 115s3, a first lower flat area 115f2, a second lower inclined stepped area 115s2, a second lower flat area 115f1, a third lower inclined stepped area 115s1, sequentially arranged in a first horizontal direction X parallel to the upper surface of the substrate 103.

The first lower inclined stepped area 115s3 may be formed on a level higher than the second lower inclined stepped area 115s2, and the second lower inclined stepped area 115s2 may be formed on a level higher than the third lower inclined stepped area 115s1. The first lower flat area 115f2 may be formed on a level higher than the second lower flat area 115f1.

Subsequently, a process substantially the same as that described with reference to FIGS. 1A through 10B may be performed to form a lower capping insulating layer 125f. For example, forming the capping insulating layer 125f may include processes from a process of forming the planarization stop layer (21 of FIGS. 2A to 2C) as illustrated in FIGS. 2A to 2D on the lower stacked structure 115 to the annealing process (35 in FIG. 10A) described with respect to FIG. 10A. Thus, the lower capping insulating layer 125f may include an upper surface 125U having a first surface 125fU1 higher than the upper surface of the uppermost layer 117U and a second surface 125fU2 on a level lower than the first surface 125fU1.

The lower capping insulating layer 125f may cover the stepped areas 115s1, 115f1, 115s2, 115f2, and 115s3 of the lower stacked structure 115, and the second region 103b of the substrate 103 on which the lower stacked structure 115 is not formed.

In the upper surface 125U of the lower capping insulating layer 125f, the first surface 125fU1 may include a first upper inclined portion 125fs3, a first upper flat portion 125ff2, a first intermediate inclined portion 125fs2, a first lower flat portion 125ff1 and a first lower inclined portion 125fs1, sequentially arranged in the first horizontal direction X.

In some embodiments, the first lower flat portion 125ff1 may be formed at a lower level than the first upper flat portion 125ff2.

In some embodiments, the first upper inclined portion 125fs3 may be formed on a level higher than the first intermediate inclined portion 125fs2, and the first intermediate inclined portion 125fs2 is formed at a higher level than the first lower inclined portion 125fs1.

In some embodiments, a buffer insulating layer 123 may be formed between the lower capping insulating layer 125f and the lower stacked structure 115. In some embodiments, an upper surface of the uppermost layer 117U may be lower than an uppermost end of the first surface 125fU1 by a distance H1a as illustrated in FIG. 13B.

Referring to FIGS. 14A and 14B, a sacrificial vertical structure 139 penetrating through a portion of the lower stacked structure 115 may be formed.

An upper stacked structure 215 may be formed on the lower stacked structure 115. A stacked structure 214 including the lower stacked structure 115 and the upper stacked structure 215 that are sequentially stacked may be formed.

The upper stacked structure 215 may be formed on the first surface 115U1 of the upper surface of the lower stacked structure 115, and the second surface 115U2 of the upper surface of the lower stacked structure 115 may be exposed.

The upper stacked structure 215 may include a plurality of first upper layers 217 and a plurality of second upper layers, corresponding to, respectively, the plurality of first layers (17 of FIGS. 2B to 2D) and the plurality of second layers (19 of FIGS. 2B to 2D) described in FIGS. 2B to 2D. An uppermost layer 217U of the upper stacked structure 215 may be the first upper layer 217.

Stepped areas 215s4, 215s3, 215f2, 215s2, 215f1, and 215s1 of the upper stacked structure 215 may include a second upper stepped area 215s4, a second upper inclined stepped area 215s3, a second upper flat area 215f2, a second intermediate inclined stepped area 215s2, a second lower flat area 215f1 and a second lower inclined stepped area 215s1, arranged in the first horizontal direction X. In the upper stacked structure 215, regions other than the stepped areas 215s4, 215s3, 215f2, 215s2, 215f1, and 215s1 may be defined as stacking areas.

The stacked structure 214 may include a stacking area 214A1 and a stepped area 214A2 adjacent to the stacking area 214A1. A stepped area of the lower stacked structure 115 and a stepped area of the upper stacked structure 215 may be formed on the stepped area 214A2 of the stacked structure 214.

Subsequently, processes substantially the same as or similar to those described with reference to FIGS. 1A through 10B may be performed to form an upper capping insulating layer 225f. For example, forming the upper capping insulating layer 225f may include performing a process of forming the planarization stop layer (21 in FIGS. 2A-2C) on the upper stacked structure 215 as illustrated in FIGS. 2A-2D, to the annealing process (35 in FIG. 10A) described with reference to FIG. 10A. Thus, the upper capping insulating layer 225f may include an upper surface having a first surface 225fU1 higher than the upper surface of the uppermost layer 217U and a second surface 225fU2 on a level lower than the first surface 225fU1.

The upper capping insulating layer 225f may cover the stepped areas 215s4, 215s3, 215f2, 215s2, 215f1, and 215s1 of the upper stacked structure 215, and may cover an upper surface of the lower stacked structure 115 on which the upper stacked structure 215 is not formed, and the lower capping insulating layer 125f.

An upper surface of the upper capping insulating layer 225f may have a first surface 225fU1 and a second surface 225fU2 lower than the first surface 225fU1.

In the upper surface 225U of the upper capping insulating layer 225f, the first surface 225fU1 may include an upper portion 225fUa, a second upper inclined portion 225fs3, a second upper flat portion 225ff2, a second intermediate inclined portion 225fs2, a second lower flat portion 225ff1 and a second lower inclined portion 225fs1, sequentially arranged in the first horizontal direction X.

In some embodiments, the second lower flat portion 225ff1 may be formed at a lower level than the second upper flat portion 225ff2.

In some embodiments, the second upper inclined portion 225fs3 may be formed on a level higher than the second intermediate inclined portion 225fs2, and the second intermediate inclined portion 225fs2 may be formed at a higher level than the second lower inclined portion 225fs1.

Referring to FIGS. 15A and 15B, a first upper insulating layer 236 may be formed on the upper stacked structure 215 of FIG. 14A. An upper channel hole 238U may be formed to penetrate through the first upper insulating layer 236 and the upper stacked structure 215 of FIG. 14A and to expose the sacrificial vertical structure 139 of FIG. 14A. The exposed sacrificial vertical structure 139 of FIG. 14A may be removed to form a lower channel hole 238L.

A vertical memory structure 239 may be formed in the upper channel hole 238U and the lower channel hole 238L. The vertical memory structure 239 may include an upper vertical memory structure 239U in the upper channel hole 238U and a lower vertical memory structure 239L in the lower channel hole 238L.

The vertical memory structure 239 may include components the same as or similar to those of the vertical memory structure 39 described with reference to FIG. 12B, and, for example, the vertical memory structure 239 may include the core region 49, the pad pattern 51, and the dielectric structure 42, and the channel semiconductor layer 47.

A second upper insulating layer 253 may be formed on the first upper insulating layer 236. A separation trench 256 penetrating the second upper insulating layer 253, the first upper insulating layer 236, and the stacked structure 214 (see FIG. 14A) may be formed.

The stacked structure 214 of FIG. 14A may include second layers corresponding to the plurality of second layers (19 of FIGS. 2B to 2D) described with reference to FIGS. 2B to 2D, and the separation trench 256 may expose second layers corresponding to the plurality of second layers (19 of FIGS. 2B to 2D) of the stacked structure 214 described in FIGS. 2B to 2D. These exposed second layers may be replaced with gate layers 259. The gate layers 259 may be the same as or similar to the gate layers (59 of FIG. 12B) described with reference to FIG. 12B.

A separation structure 260 may be formed to fill the separation trench 256. Subsequently, a third upper insulating layer 262 may be formed on the second upper insulating layer 253. A bit line contact plug 267 may be formed to penetrate through the third upper insulating layer 262 and the second upper insulating layer 253. A bit line 270 may be formed on the bit line contact plug 267.

The semiconductor device may be formed by the method as described above with reference to FIGS. 13A through 15B. The semiconductor device thus formed may be formed to have a structure as illustrated in FIGS. 15A and 15B. For example, a semiconductor device formed by a method of forming a semiconductor device according to an example embodiment of the present inventive concept may include the stacked structure 215', and the lower capping insulating layer 125f and the upper capping insulating layer 225f as described with reference to FIGS. 13B and 14B. Accordingly, in the method as described above with reference to FIGS. 13A through 15B, the semiconductor device may include components formed by the method of forming the semiconductor device described above with reference to FIGS. 13A through 15B. Thus, the semiconductor device forming method described with reference to FIGS. 13A through 15B may be described, and therefore, detailed description of the structure of the semiconductor device will be omitted herein.

According to example embodiments, a stacked structure having a stepped area (15A2 of FIG. 2A) is formed, a capping insulating layer (25 of FIG. 2A) is formed to cover the stepped area of the stacked structure (15 of FIG. 2A), the capping insulating layer (25 of FIG. 2A) is patterned to form protrusions (25P1, 25P2 and 25P3 of FIG. 7) overlapping the stepped area and spaced from each other in a horizontal direction, the capping insulating layer (25c of FIG. 7) having the protrusions (25P1, 25P2 and 25P3 of FIG. 7) is planarized, the planarized capping insulating layer (25d of FIG. 8) is partially etched, and the partially etched capping insulating layer (25e of FIG. 9) is densified by performing an annealing process (35 of FIG. 10A), thereby forming a densified capping insulating layer (25f of FIG. 10A). Such a method of forming the densified capping insulating layer (25f of FIG. 10A) may be used to form the lower capping insulating layer 115f in FIG. 13A and the upper capping insulating layer 215f in FIG. 14A.

According to example embodiments, in the method of forming the densified capping insulating layer (25f of FIG. 10A), since the flatness of the densified capping insulating layer 25f (see FIG. 10A) formed on the stepped area 15A2 of the stacked structure 15 (see FIG. 2A) may be improved, the productivity of the semiconductor device may be improved.

As set forth above, according to example embodiments, a method capable of improving the flatness of a capping insulating layer covering a stepped area of a stacked structure may be provided. The degree of integration of the semiconductor device formed using such a method may be improved, and the productivity of the semiconductor device may be improved.

While example embodiments have been illustrated and described above, it will be apparent to those skilled in the art that modifications and variations could be made without departing from the scope of the present inventive concept as defined by the appended claims. The above-disclosed subject matter is to be considered illustrative, and not restrictive, and the appended claims are intended to cover all such modifications, enhancements, and other embodiments, which fall within the true spirit and scope of the inventive concept.

What is claimed is:

1. A method of forming a semiconductor device, the method comprising:

forming a stacked structure and a planarization stop layer on a first region of a substrate, the stacked structure including a stacking area including a flat upper surface and a stepped area that is adjacent to the stacking area and includes an upper surface having a stepped shape, the stacked structure including a plurality of first layers and a plurality of second layers stacked alternately with the plurality of first layers in a vertical direction that is perpendicular to an upper surface of the substrate, an uppermost layer of the stacked structure being an uppermost one of the plurality of first layers, and the stacked structure being between the substrate and the planarization stop layer;

forming a capping insulating layer on the planarization stop layer and the stacked structure and on a second region of the substrate adjacent to the first region of the substrate, the capping insulating layer including a first capping region including a first upper surface, and a second capping region including a second upper surface at a lower level than the first upper surface;

patterning the capping insulating layer to form a plurality of protrusions spaced apart from each other in a horizontal direction on the first region of the substrate, the horizontal direction parallel to the upper surface of the substrate, and at least one of the plurality of protrusions overlapping the stepped area;

planarizing the capping insulating layer including the plurality of protrusions to form a planarized capping insulating layer;

partially etching the planarized capping insulating layer to form a partially etched capping insulating layer;

performing an annealing process to convert the partially etched capping insulating layer to a densified capping insulating layer;

forming a first upper insulating layer on the densified capping insulating layer and the uppermost layer of the stacked structure;

forming a channel hole extending through the first upper insulating layer and the stacking area of the stacked structure;

forming a vertical memory structure in the channel hole;

forming a contact plug on the vertical memory structure; and forming a bit line on the contact plug.

2. The method of claim 1, further comprising, after forming the partially etched capping insulating layer, prior to the annealing process, removing the planarization stop layer to expose the uppermost layer of the stacked structure.

3. The method of claim 1, wherein the stepped area of the stacked structure comprises at least one flat area and at least one inclined stepped area adjacent to the at least one flat area.

4. The method of claim 3, wherein one of the plurality of protrusions overlaps the at least one inclined step area.

5. The method of claim 1, wherein at least a portion of each of the plurality of protrusions is removed during planarizing the capping insulating layer.

6. The method of claim 1, wherein an upper surface of the densified capping insulating layer comprises a first surface and a second surface at a lower level than the first surface, and an uppermost end of the first surface is higher by a first height than an upper surface of the uppermost layer of the stacked structure.

7. The method of claim 6, wherein the first height is less than a thickness of each of the plurality of second layers.

8. The method of claim 1, further comprising:

forming a second upper insulating layer on the vertical memory structure and the first upper insulating layer;

forming a separation trench that extends through the second upper insulating layer, the first upper insulating layer, and the stacked structure and exposes the plurality of second layers of the stacked structure; and replacing the plurality of second layers exposed by the separation trench with a plurality of gate layers, respectively; and forming a separation structure in the separation trench, wherein each of the plurality of first layers is formed of an insulating material.

9. The method of claim 1, wherein the partially etched capping insulating layer includes an upper surface at a level between a lower surface of the planarization stop layer and an upper surface of the planarization stop layer.

10. The method of claim 1, wherein a volume of the partially etched capping insulating layer is reduced by performing the annealing process.

11. The method of claim 1, wherein the annealing process is performed for 30 minutes to 2 hours at a temperature of 500° C. to 850° C.

12. The method of claim 1, wherein patterning the capping insulating layer includes sequentially performing a plurality of etching processes on the capping insulating layer, and each of the plurality of protrusions is formed by performing a respective one of the plurality of etching processes.

13. The method of claim 12, wherein sequentially performing the plurality of etching processes includes performing a first etching process using a first etch mask and performing a second etching process using a second etch mask after performing the first etching process, and wherein an edge of the first etch mask is spaced apart from an interface between the stacking area and the stepped area in the horizontal direction by a first distance, and an edge of the second etch mask is spaced apart from the interface between the stacking area and the stepped area in the horizontal direction by a second distance that is shorter than the first distance.

14. A method of forming a semiconductor device, the method comprising:

forming a first stacked structure on a first region of a substrate, the first stacked structure including a first stacking area and a first stepped area adjacent to the first stacking area, the first stacked structure including a plurality of first layers and a plurality of second layers stacked alternately with the plurality of first layers in a vertical direction that is perpendicular to an upper surface of the substrate, the plurality of second layers being arranged in a stepped shape in the first stepped area;

forming a first capping insulating layer on the first stacked structure on the first region of the substrate and on a second region of the substrate adjacent to the first region of the substrate, the first capping insulating layer including a first capping region including a first upper surface, and a second capping region including a second upper surface at a lower level than the first upper surface;

patterning the first capping insulating layer to form a plurality of first protrusions spaced apart from each other in a horizontal direction on the first region of the substrate, the horizontal direction being parallel to the upper surface of the substrate, and at least one of the plurality of first protrusions overlapping the first stepped area; and planarizing the first capping insulating layer including the plurality of first protrusions.

15. The method of claim 14, further comprising, after planarizing the first capping insulating layer, performing a first annealing process to increase a density of the first capping insulating layer by reducing a volume of the first capping insulating layer.

16. The method of claim 15, further comprising:
after the first annealing process,
forming a second stacked structure on the first stacked structure, the second stacked structure including a second stacking area and a second stepped area adjacent to the second stacking area, the second stacked structure including a plurality of first upper layers and a plurality of second upper layers stacked alternately with the plurality of first upper layers in the vertical direction, the plurality of second upper layers being arranged in a stepped shape in the second stepped area;

forming a second capping insulating layer on the second stacked structure and on the first capping insulating layer;

patterning the second capping insulating layer to form a plurality of second protrusions spaced apart from each other in the horizontal direction, at least one of the plurality of second protrusions overlapping the second stepped area; and planarizing the second capping insulating layer including the plurality of second protrusions.

17. The method of claim 16, further comprising, after planarizing the second capping insulating layer, performing a second annealing process to increase a density of the second capping insulating layer by reducing a volume of the second capping insulating layer.

18. The method of claim 16, further comprising forming a vertical memory structure extending through the second stacked structure and the first stacked structure after planarizing the second capping insulating layer.

19. A method of forming a semiconductor device, the method comprising:
forming a stacked structure on a first region of a substrate, the stacked structure including a stacking area and a stepped area adjacent to the stacking area and including a plurality of first layers and a plurality of second layers stacked alternately with the plurality of first layers in a vertical direction that is perpendicular to an upper surface of the substrate, the plurality of second layers being arranged in a stepped shape in the stepped area, and the stepped area of the stacked structure including at least one flat area and at least one inclined stepped area adjacent to the at least one flat area;

forming a capping insulating layer on the stacked structure and on a second region of the substrate adjacent to the first region of the substrate, the capping insulating layer including a first capping region including a first upper surface, a second capping region including a second upper surface at a lower level than the first upper surface;

patterning the capping insulating layer to form a plurality of protrusions spaced apart from each other in a horizontal direction on the first region of the substrate, the horizontal direction being parallel to the upper surface of the substrate, and at least one of the plurality of protrusions overlapping the stepped area; and planarizing the capping insulating layer including the plurality of protrusions.

20. The method of claim 19, wherein at least one of the plurality of protrusions comprises opposing sides that have different inclinations, and a first side of the opposing sides that is closer to the stacking area is steeper than a second side opposite to the first side.

* * * * *